United States Patent
Harland et al.

(10) Patent No.: US 10,860,305 B1
(45) Date of Patent: Dec. 8, 2020

(54) SECURE FIRMWARE DEPLOYMENT

(71) Applicant: Amazon Technologies, Inc., Seattle, WA (US)

(72) Inventors: Jason Alexander Harland, Seattle, WA (US); Matthew Shawn Wilson, Bainbridge Island, WA (US); Darin Lee Frink, Lake Tapps, WA (US); Nafea Bshara, San Jose, CA (US); Ziv Harel, Kibbutz Megiddo (IL); Anthony Nicholas Liguori, Bainbridge Island, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/721,307

(22) Filed: Sep. 29, 2017

(51) Int. Cl.
  *G06F 9/44* (2018.01)
  *G06F 8/65* (2018.01)
  *G06F 13/40* (2006.01)
  *G06F 9/4401* (2018.01)
  *G06F 9/54* (2006.01)
  *H03K 19/177* (2020.01)

(52) U.S. Cl.
  CPC .............. *G06F 8/65* (2013.01); *G06F 9/4411* (2013.01); *G06F 9/54* (2013.01); *G06F 13/4063* (2013.01); *H03K 19/177* (2013.01)

(58) Field of Classification Search
  CPC ....................................................... G06F 8/65
  See application file for complete search history.

(56) References Cited

U.S. PATENT DOCUMENTS

| | | | | |
|---|---|---|---|---|
| 2003/0088762 A1* | 5/2003 | Liang | .................... | G06F 9/4406 713/1 |
| 2003/0163640 A1* | 8/2003 | Pruett | ................... | G06F 3/0607 711/114 |
| 2007/0174686 A1* | 7/2007 | Douglas | .............. | G06F 11/2097 714/13 |
| 2007/0226727 A1* | 9/2007 | Yeh | ........................ | G06F 8/65 717/168 |
| 2008/0052698 A1* | 2/2008 | Olson | ................. | G06F 9/44589 717/168 |
| 2013/0290946 A1* | 10/2013 | Iwadate | .................... | G06F 8/65 717/168 |
| 2016/0246754 A1* | 8/2016 | Rao | ....................... | G06F 13/4286 |
| 2017/0277530 A1* | 9/2017 | Adams | ..................... | G06F 8/65 |

* cited by examiner

*Primary Examiner* — Hang Pan
(74) *Attorney, Agent, or Firm* — Klarquist Sparkman, LLP

(57) ABSTRACT

A server includes a motherboard and a programmable logic device coupled to the motherboard. The server also includes a hardware device coupled to the motherboard and the programmable logic device. The server further includes a non-volatile memory storing firmware for the hardware device. The non-volatile memory is coupled to the motherboard and the programmable logic device. The server further includes a peripheral device coupled to the motherboard and the programmable logic device. The peripheral device receives firmware data from a management server. The peripheral device verifies that the firmware data corresponds to the hardware device. The peripheral device further holds the hardware device in reset mode. The peripheral device stores the firmware data on the non-volatile memory to update the firmware and releases the hardware device from reset mode after updating the firmware.

18 Claims, 9 Drawing Sheets

SECURE FIRMWARE DEPLOYMENT

BACKGROUND

As an increasing number of applications and services are being made available over networks such as the Internet, an increasing number of content, application, and/or service providers are turning to technologies, such as cloud computing. Cloud computing, in general, is an approach to providing access to electronic resources through services, such as Web services, where the hardware and/or software used to support those services is/are sometimes scalable to meet the needs of the services at any given time. A user or customer typically may rent, lease, or otherwise pay for access to resources through the cloud, and thus does not have to purchase and maintain the hardware and/or software needed.

Firmware image management is an important issue in multi-user server environments. Firmware management may consist of maintaining the firmware of various components of a server motherboard up-to-date. However, updating the firmware of a component may be a complex operation and typically involves a risk of damaging one or more components of the server. For example, operations, such as flashing a BIOS, may be susceptible to malicious code attacks, possibly from user software that is running on the server. Malicious code may install defective software during flashing, thereby causing irreversible damage to, or changing the operation of, the BIOS. Further, conventional methods of updating firmware may also require large system downtimes.

DETAILED DESCRIPTION

Figure 1:
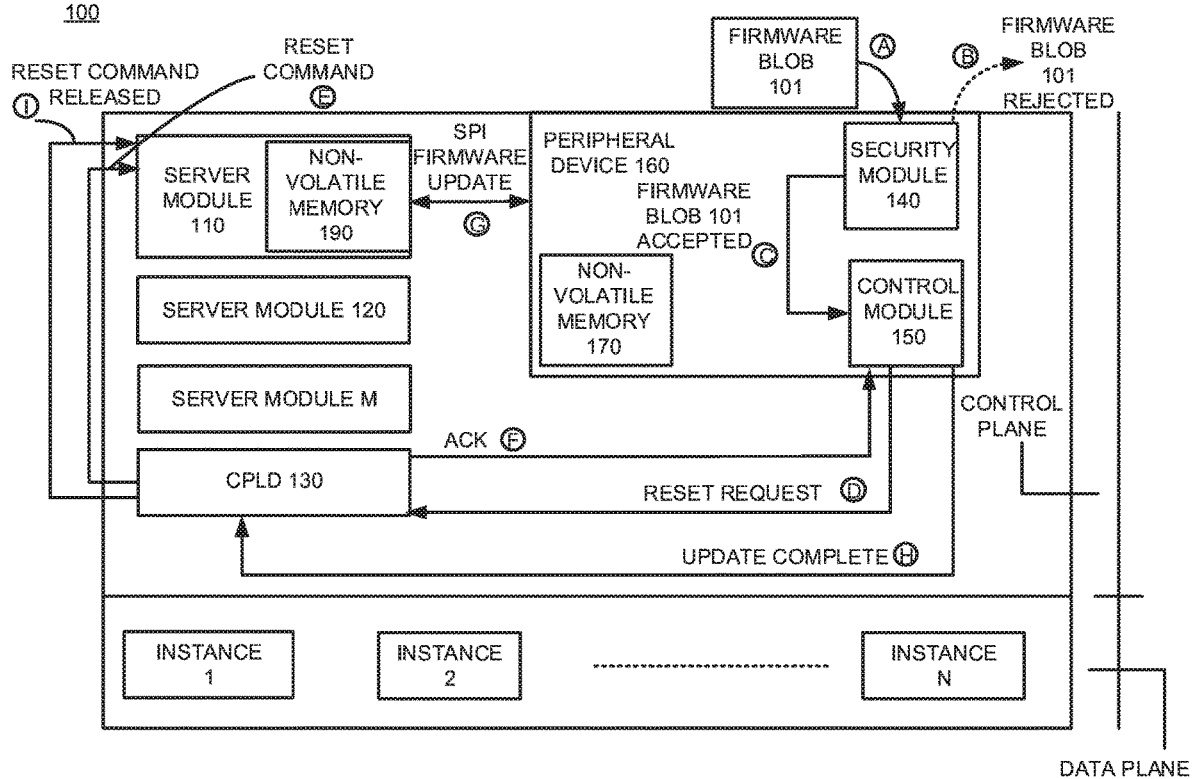
FIG. 1 illustrates a hardware level embodiment of an example server, with an emphasis on the process flow, according to certain aspects of the present disclosure.

In the following description, various embodiments will be illustrated by way of examples and not by way of limitation in the figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

A compute service system may typically include a plurality of servers that can host data and can be used by multiple clients or organizations to run instances, such as virtual machine instances or non-virtualization instances such as bare-metal instances (e.g., operating systems that run directly on the server hardware). In most cases, instances, such as non-virtualized or virtual machine instances, in a multi-tenant compute service system may be allocated to a client when the client needs them and decommissioned when they are no longer needed, such that the resources can be reallocated to other clients. In the present disclosure, the terms "tenant," "client," and "customer" may be used interchangeably and do not necessarily imply the existence of a commercial relationship. The term "instance" may refer to, for example, an instance that is executed directly on server hardware or as a virtual machine. Different types of instances generally correspond to different hardware functions.

Typically, the operator of the compute service uses its own virtualization system (e.g., a hypervisor or virtual machine monitor) on the servers and the clients only receive access to the instances. In some cases, a client may prefer to run directly on the server's hardware or use its own virtualization system to instantiate its own virtual machines as needed. For example, a client may want to use a customer hypervisor, make specific changes to a commercially available hypervisor to enable certain models, or prefer one hypervisor over another. In addition, in a virtualized compute service system, performance degradation may occur due to the introduction of a hypervisor layer. While the hypervisor enables the visibility, flexibility, and management capabilities required to run multiple virtual machines on the same resources, it also creates additional processing overhead and may not integrate with tools the user wants to use with the hypervisor. However, if access to the hardware is granted, a customer may potentially damage the hardware or attempt to modify the firmware to attack future customers that use the hardware.

For example, in a non-virtualized environment such as a bare-metal environment, a customer may try to modify the firmware on the server to adversely affect the execution environment when the server is rebooted and provided to a second customer. In some embodiments, the firmware may direct data on the server to an unsecure location, thus compromising the security of the data of the second client on the server.

Systems and methods in accordance with various embodiments of the present disclosure provide an environment for secure firmware deployment on servers in a compute service system. In an embodiment, the server includes a motherboard, a processor-based device (which in some embodiments can be implemented as a peripheral device) coupled to the motherboard or to a programmable logic device coupled to the motherboard, and the programmable logic device. The peripheral device may be any form of computational system, encompassing integrated, peripheral, or any other form of processing element capable of performing algorithms and storing values. In some embodiments, for example, the peripheral device can comprise a microprocessor on an expansion card that is coupled to the motherboard through a PCIe slot or other interface. In some embodiments, the programmable logic device includes several logic blocks with configurable characteristics. Example of the programmable logic device includes, but not limited to, Programmable Logic Array (PLA), Generic Array Logic (GAL), Complex Programmable Logic Device (CPLD), and so forth. The server also includes one or more hardware devices coupled to the motherboard and the programmable logic device. The hardware devices may include any device coupled to the motherboard such as, but not limited to, a processor, a Power Supply Unit (PSU), a Baseboard Management Controller (BMC), a basic input/output system (BIOS), and so forth.

The server can further include a secure storage block. A secure storage block (or simply secure storage) can refer to a secure flash, a non-volatile memory, a processor memory, etc. for storing firmware for the one or more hardware devices. The non-volatile memory may be coupled to the motherboard, the peripheral device, and/or the programmable logic device. Examples of non-volatile memory may include, but are not limited to, Read-Only Memory (ROM), flash memory, Random Access Memory (RAM), several types of computer storage devices (e.g., hard disk drives, floppy disks, and magnetic tape), and so forth. Further, the hardware device may itself be communicably coupled to the non-volatile memory by the programmable logic device and/or the peripheral device.

As previously stated, the server also may include a peripheral device coupled to the motherboard and the programmable logic device. In some embodiments, the peripheral device may include various components such as, a processor, a memory, timing circuits, external interfaces, power management circuits and so forth. The peripheral device includes instructions that, upon execution by the processor, cause the peripheral device to perform various actions. In some embodiments, the instructions are stored in the memory of the peripheral device. In an embodiment, the peripheral device may receive firmware data from a management server. The firmware data may include a firmware image for at least one hardware device. The firmware image may include non-transitory executable code such as, but not limited to, BIOS firmware code, PSU firmware code, BMC firmware code, or any other firmware code for any other hardware component resident on the server. In some embodiments, the peripheral device stores the firmware data on the memory. In an embodiment, the firmware image may include a multiple sets of firmware images configured to update multiple hardware devices of the motherboard simultaneously.

Further, the peripheral device verifies that the firmware data corresponds to a hardware device. The peripheral device may identify the hardware device corresponding to the firmware data based on a comparison of one or more identifiers in the firmware data with a list of identifiers stored in the memory. In some embodiments, the peripheral device may further authenticate the firmware data as transmitted by the management server and exclude malware by isolating unsigned Unified Extensible Firmware Interface (UEFI) images. In an embodiment, if the peripheral device identifies the firmware data as a corrupted file or as containing a malicious code, the peripheral device may reject the firmware data and block the deployment of the firmware data. Further, the peripheral device may transmit a message to the management server indicative of rejection of the firmware data.

In case the peripheral device verifies that the firmware data contains an appropriate firmware image for the hardware device, the peripheral device may hold the hardware device in a reset mode via the programmable logic device. The reset mode may be a prolonged state in which the hardware device is held in some state of suspension while the hardware device firmware is updated/replaced. The reset mode could be a reset mode (i.e., the hardware device is temporarily turned off during a firmware update flash), or could be any other action that prevents the hardware device from rejecting the update, corrupting the update, or even functioning altogether during the firmware update (sleep mode, etc.). Additionally, this process can occur during the run-time of the server (e.g., all server components are powered on), or may occur during the start-up of the server, before the hardware device has even been powered up (and is thus already in a reset mode mode). In this instance, the peripheral device may hold any or all of the plurality of hardware devices in reset mode until it has concluded that each queued firmware update has been deployed. At this point, the peripheral device may allow the hardware devices to be powered up.

During deployment, the peripheral device may establish a communication channel with a non-volatile memory corresponding to the hardware device. The peripheral device then stores the firmware data on the non-volatile memory to update firmware of the hardware device. In some embodiments, the peripheral device establishes a communication channel parallel to the communication channel used by the hardware device to communicate directly with the non-volatile memory. Holding the at least one hardware device in a reset mode and establishing a separate communication channel with the non-volatile memory may allow other hardware devices of the motherboard to remain operational during the updating process.

In some embodiments, the peripheral device may store the firmware data on the memory after verification of the firmware data. In some other embodiments, the peripheral device may postpone the process of storing the firmware data, and may store the firmware data after a predetermined time interval is lapsed. In an embodiment, the predetermined time interval may be based upon the usage of the hardware device corresponding to the firmware image. For example, the peripheral device may update the firmware of the hardware device without interrupting an ongoing process and may schedule the update when the hardware device is not in use. In an embodiment, the server includes at least one multiplexer configured to selectively coupled the non-volatile memory with the hardware device based on a control signal received from the programmable logic device. In some other embodiments, the at least one multiplexer is configured to selectively couple the non-volatile memory with the peripheral device based on a control signal received from the programmable logic device. For example, one or more multiplexers may communicably couple the hardware device with the non-volatile memory during normal operation. During updating of the firmware stored on the non-volatile memory, the one or more multiplexers may isolate the hardware device from the non-volatile memory, and establish a communication channel between the peripheral device and the non-volatile memory. In alternative embodiments, the hardware device may include an embedded memory to store the firmware and the one or more multiplexers may directly couple the hardware device with the peripheral device. The peripheral device may control the one or more multiplexers via the programmable logic device. In yet another embodiment, the programmable logic device may directly couple the peripheral device with the non-volatile memory associated with the hardware device.

Different accessibilities to different regions of the non-volatile memory at different times by different components may be controlled by the peripheral device and the programmable logic device. In some embodiments, the server includes one or more multiplexers to selectively couple the non-volatile memory with different hardware devices based on control signals received from the programmable logic device. For example, during normal operation, some or all regions of the non-volatile memory may be readable by some or all components of the server, and some or all regions of the non-volatile memory may be writable by some or all components of the server. During updating of the firmware of one or more hardware devices, some or all regions of the non-volatile memory may not be readable by some or all components of the server, and some or all regions of the non-volatile memory may not be writable by some or all components of the server. Additionally, during updating, some untrusted components of the server, for example, components that may have unsecure network access, such as a BMC, may be disconnected from the processor, such that a client execution environment and client data may not be accessible to the untrusted components of the server.

Further, the peripheral device may update the firmware by replacing a loaded firmware image of the hardware device with an updated firmware image received from the management server. In some embodiments, the peripheral device may update the firmware of the hardware device based on a latest version of the firmware. In some other embodiments, the peripheral device may restore the firmware of the hardware device to a previous or current version. The peripheral device may release the hardware device from reset mode via the programmable logic device after updating or restoring the firmware.

It is noted that although embodiments in the present disclosure describe secure firmware deployment on the non-volatile memory coupled to the hardware device, techniques disclosed herein can be used to secure deployment of firmware data on any user-accessible volatile or non-volatile memory coupled to any user accessible hardware device. For example, techniques disclosed herein can be used to protect any software (for example, a software including BIOS code) that a user can execute on a server, either directly or remotely through a network, such as via an unsecured agent (e.g., the BMC). The software may be stored in a volatile or non-volatile memory.

In some embodiments, the peripheral device may hold the hardware device in the reset mode while updating the firmware to prevent any malicious code attack from a client. Specifically, during reset mode, the hardware device is non-operational, and therefore cannot be accessed by any client device. Thus, the security of the server system is improved.

For the purposes of this disclosure, the terms "reset mode" and "reset" are interchangeably used. If a hardware device of a server is held in reset mode, the hardware device is non-operational.

Further, the term "hardware device" may refer to any hardware component of a server including, but not limited to, a processor, a Power Supply Unit (PSU), a Baseboard Management Controller (BMC), or any component coupled to a motherboard of the server.

Various embodiments of the present disclosure are described hereinafter with reference to FIGS. 1-7.

FIG. 1 illustrates a generalized embodiment relating to an example of some of the previously described processes that the peripheral device may perform. However, it should be noted that FIG. 1 is provided solely for high-level descriptive purposes and is not intended to limit the scope of the claimed invention in any way, such as by the number/category of components, component functionality, data flow, or in any other way.

In FIG. 1, a server 100 is depicted as having a peripheral device 160, comprising a security module 140 a control module 150, and a non-volatile memory 170. In general, the peripheral device 160 also comprises a number of other components/modules such as input/output ports/devices, etc. which are not illustrated in FIG. 1 for illustrative simplicity. The server 100 may also house numerous other hardware devices such as server modules 110, 120-M without limitation. The server modules 110, 120-M, may be or may be comprised of any of the previously mentioned hardware devices or components, such as BIOS, BMC, Power Supply, or anything else. Each of these components usually reside in the control plane of the server 100 as illustrated in FIG. 1. The server 100 also typically houses a data plane comprising instances 1-N such as virtual machine instances (VMI's), non-virtualized instances (bare-metal instances), etc. As depicted in FIG. 1, any of the server modules (such as server module 110) may also house a non-volatile memory such as non-volatile memory 190 that can store firmware data pertinent to the operation of the server module.

In FIG. 1, a firmware blob 101 is received by the server 100 at flow element A. The firmware blob 101 comprises an assembly of one or more firmware updates to be deployed in any of the server modules 110, 120-M, including the CPLD 130 (which is also a server module). The firmware blob 101 may also include other metadata, instructions, etc. as may be necessary for the successful deployment of the firmware update(s). The firmware blob 101 may be first processed through a security module 140 in the peripheral device 160 to ascertain the authenticity of the firmware blob 101. This may be performed by any number of authentication methods described later in greater detail. If the firmware blob 101 is rejected for any reason, it is discarded at flow element B. In some instances, the server 100 may also dispatch a message to a management server to indicate that the firmware blob 101 was discarded, and may also indicate the parameters leading to the rejection of the firmware blob 101, such as suspected malicious activity (invalid checksums, unknown sources, etc.), corruption of the firmware blob 101, or anything else that may be deemed to be relevant relating to the rejection.

If the firmware blob 101 is not rejected, the firmware blob 101 may proceed to a control module 150 via flow element C. As will be described later in greater detail, the peripheral device 160 may comprise numerous elements such as a non-volatile memory 170 to store the firmware blob 101. Upon receiving the firmware blob 101, the control module 150 may perform various actions. Initially, the control module 150 may store the firmware blob 101 prior to performing any subsequent processing. The control module 150 may also unpack the one or more firmware updates, and identify if one or more firmware updates bundled in the firmware blob 101 can be immediately deployed, or require scheduling. In some instances, updating some subset of the server modules 110, 120-M can be performed immediately depending on the module type, firmware payload, or based on any other metric of the firmware blob 101 or its constituent components. In other instances, one or more firmware updates may require some form of scheduling to avoid negative consequences, such as migrating or restricting the availability of instances 1-N to clients. Some potentially negative consequences include kicking clients off of the server 100, installing firmware updates out of order, etc.

For example, updates to certain server modules (such as a BIOS module) can directly affect the ability of a client to interact with their rented or purchased instance(s). These updates can be scheduled based on any criterion, such as when a client's instance(s) has been dormant for a predetermined period of time, when a client fails to update their subscription, at a certain time of day, upon a reset of the server 100, etc.

As previously stated, the peripheral device 160 can perform firmware updates to the server modules 110, 120-M on a startup of the server 100 or during server 100 run-time. In the former instance, the peripheral device 160 may be configured to disallow power to any other server modules 110, 120-M (including CPLD 130) until it has identified any received and accepted firmware blobs 101. At this point, the peripheral device 160 may authorize the control module 150 to perform an action. If a firmware update for the processor CPLD 130 is pending, the control module 150 may perform the CPLD 130 firmware update first. If a firmware update for the CPLD 130 is not pending or has been completed, the control module 150 device may allow the CPLD 130 to have power and continue the firmware update process.

In the case of a run-time firmware update, the control module 150 may decide to initiate a firmware deployment based on a trigger, such as a static or dynamic time delay, or based on a user action (such as logging off, re-starting, etc.).

Whether the server 100 has just been powered on or is in run-time, the process then proceeds in a similar fashion. The control module 150 can dispatch a reset request at flow element D to the CPLD 130 for one or more of the server modules 110, 120-M. In the case of an initial powering up of the server 100, most or all of the server 100 modules 110, 120-M may already be in reset mode, since the peripheral device 160 has prohibited power to one or more of the server modules 110, 120-M. In this instance, the CPLD 130 may command the one or more of the server modules 110, 120-M into reset mode and send and acknowledgement "ACK" at flow element F to the control module 150. Alternatively, the CPLD 130 may query the one or more server modules 110, 120-M to deduce they are already in reset mode, and may then send an ACK at flow element F to the control module 150.

Once an ACK is received by control module 150 the peripheral device 160, the CPLD 130, or both may communicate in order to establish a communication channel between the peripheral device 160, and the one or more server modules 110, 120-M. In FIG. 1 this process is depicted at flow element G, depicting an SPI channel firmware data being deployed to server module 110. The firmware data may be stored in the non-volatile memory 190 while the server module 110 is in reset mode. Once the firmware deployment at flow element G has been completed, the control module 150 may dispatch an "update complete" message to CPLD 130 at flow element H. At this point, CPLD 130 may release the reset command for server module 110 at flow element I. This may be performed by CPLD 130 as simply restoring power to server module 110, by dispatching a message to server module 110 directing server module 110 to emerge from reset mode, or in any other way that restores the normal run-time functionality of server module 110.

Figure 2:
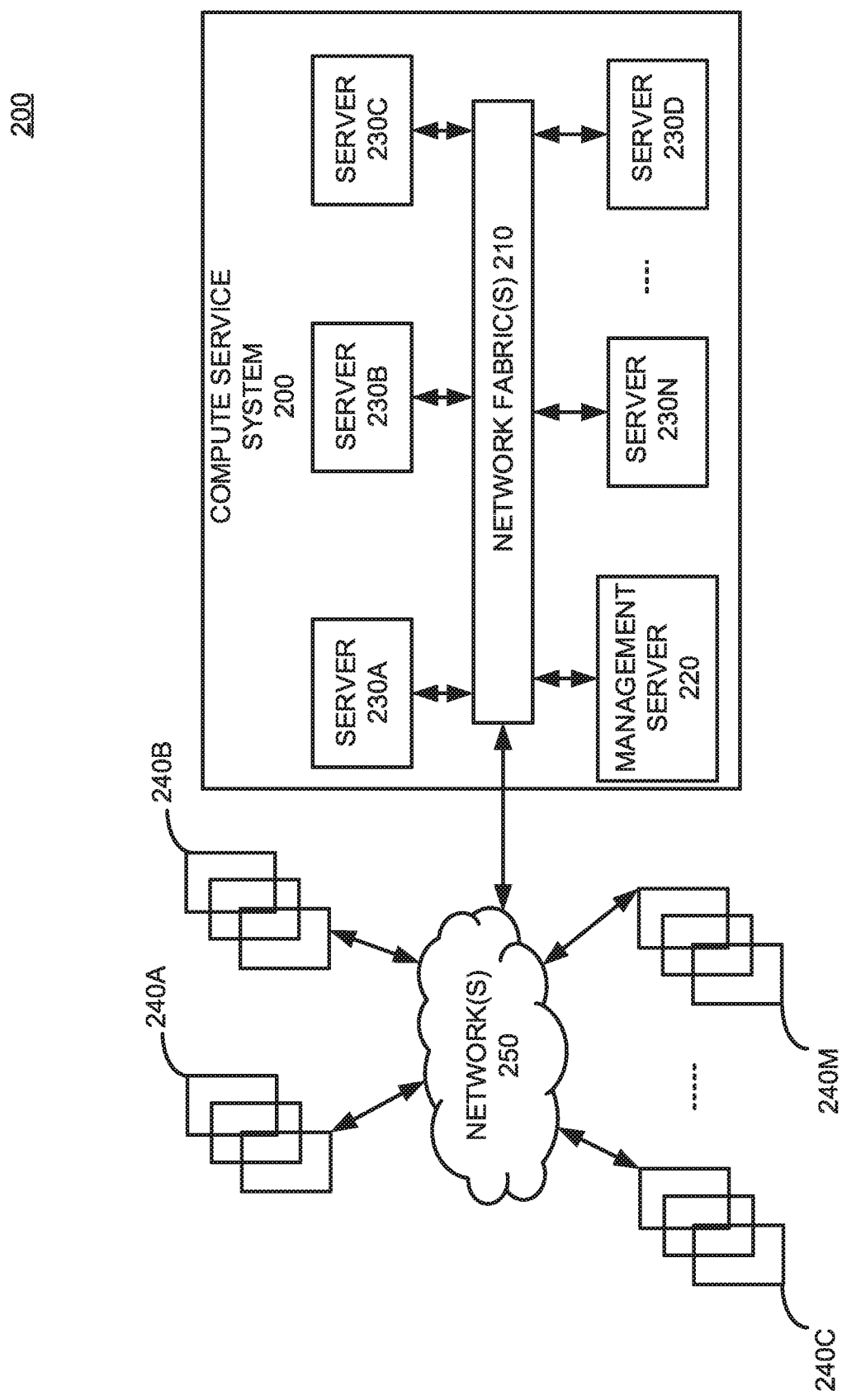
FIG. 2 illustrates an example compute service system in a service environment, according to certain aspects of the present disclosure.

FIG. 2 illustrates an example compute service system 200 in a web-based service environment, according to certain aspects of the present disclosure. In the web-based service environment, one or more clients may utilize client devices 240a-240m (collectively referred to as "the client devices 240") to access the compute service system 200 via one or more networks 250. For example, the client devices 240 may access the compute service system 200 using a web browser, a command line interface, or a web service API. The client devices 240 may include any appropriate device operable to send and receive requests, messages, or other information over the one or more networks 250 and convey information back to a client of the device, such as, but not limited to, a mobile phone, a smart phone, a Personal Digital Assistant (PDA), a laptop computer, a desktop computer, a thin-client device, a tablet, an electronic book (e-book) reader, etc.

In some examples, the networks 250 may include any one or a combination of different types of networks, such as, but not limited to, cable networks, the Internet, wireless networks, cellular networks, and other private and/or public networks. Communications over the networks 250 may be enabled by wired and/or wireless connections. The networks 250 may support communications using any of a variety of commercially-available protocols, such as Transmission Control Protocol/Internet Protocol (TCP/IP), Open System Interconnection (OSI), File Transfer Protocol (FTP), Universal Plug and Play (UPnP), Network File System (NFS), Common Internet File System (CIFS), and so forth.

The compute service system 200 may include a management server 220 and a plurality of servers 230a-230n (collectively referred to as "the servers 230") in a distributed computing environment. The management server 220 and the servers 230 may be communicatively coupled to one or more network fabrics 210, which may be connected to the networks 250 through, for example, high speed network connection, such as InfiniB and, Data Center Ethernet (DCE), gigabit Ethernet, fiber channel, or Fiber Channel over Ethernet (FCoE). The network fabrics 210 may be any appropriate network, including an intranet, the Internet, a cellular network, a local area network, or any combination thereof. The network fabrics 210 may support communication using any of a variety of high speed communication protocols.

The servers 230 may include one or more servers, arranged in a cluster as a server farm, or as individual servers not associated with one another. The servers 230 may be configured to host instances. In some implementations, each of the servers 230 may have identical or similar hardware resources. In some implementations, the servers 230 may include a plurality of different types of servers that may have different resources and/or configurations.

The management server 220 may be a server or a platform that is configured to manage a pool of heterogeneous resources (e.g., servers or specialized hardware resources), provide access to clients and end users, monitor security, and manage resource allocation. For example, the management server 220 may receive requests from the client devices 240 and select one or more servers 230 to provision the requested instance based on the specific request from the client. In some cases, the management server 220 may allocate a predetermined number of resources to a client who may pay a flat fee or a monthly fee. In some cases, for a client that is charged on a pay-per-use basis, the management server 220 may allocate resources to the client when the client needs them and decommission the resources when the resources are no longer needed, such that the resources can be allocated to other clients. The management server 220 may include a network interface for communication with the network fabrics 210, a database for storing configurations and status of the servers 230 connected to the network fabrics 210, and a processing logic for selecting one or more available servers for an instance and performing other management functions.

As described above, the client devices 240 may request different types of instances (e.g., virtual machines or servers) from the compute service system 200. For example, in some cases, a client may request an instance to perform complex computational workloads, such as batch processing, distributed analytics, high performance scientific or engineering applications, gaming, or video-encoding. In some cases, a client may request an instance for applications sensitive to network performance.

In some cases, a client may request a specific system hardware configuration. For example, the client may specify the number of processor cores, the size of the memory, the size of the storage device (e.g., a Solid State Drive (SSD)), and/or the operating system or Virtual Machine Monitor (VMM, i.e., hypervisor) needed for the applications. In some cases, the client may select a type of instance from multiple types of instances offered by the compute service system 200. For example, the compute service system 200 may offer different types or families of instances based on compute, memory, and storage capabilities, where different types of instances may provide different capabilities on computing performance, I/O performance, memory size and performance, storage size and performance, network performance, and graphic processing performance. Additionally, in some cases, the client may request a particular operating system or hypervisor to run on the server. In some cases, the client may request a specific type of hardware, such as Graphics Processing Units (GPUs) or SSDs. In some embodiments of the present disclosure, the compute service system 200 may offer one or more "non-virtualized" instance types. The non-virtualized (e.g., bare-metal) instance types can have differing combinations of hardware.

In some cases, a client's workloads and applications may demand higher performance than the virtualization layer allows, or the client may want to use a different virtualization system on hardware managed by the compute service provider. The client may rent a server as a non-virtualized instance and use its own operating system on the server, in order to remove the hypervisor and the performance impact caused by virtualization. The hardware of the non-virtualized instance may be fully dedicated to the client, including any additional storage, during the time period that the server is rented to the client.

In response to web-service requests for a non-virtualized instance from a client, the management server 220 may select one or more servers 230 to allocate to the client. For example, in implementations where servers have different hardware resources, the management server 220 may select a server that best matches the requirement of the client-requested instance with minimum extra resources. In implementations where all servers have the same or similar hardware resources, the management server 220 may randomly select any available server, or a cluster of available servers that are closely located. In some implementations, management server 220 may select a server that is capable of provisioning a non-virtualized instance.

In some embodiments, the management server 220 may also transmit firmware updates for various components of the one or more servers 230 through the network fabrics 210. In an embodiment, the management server 220 may transmit firmware data to the one or more servers 230 based on latest available versions of firmware. In another embodiment, the management server 220 may further periodically check whether the firmware of the components of the one or more servers 230 are up-to-date or corrupted. In case the firmware of any component needs updating or recovery, the management server 220 may transmit appropriate firmware data to the corresponding server 230. In a further embodiment, the management server 220 may receive requests for updating or recovering the firmware of one or more components of at least one server 230, and transmit firmware data accordingly. The requests for updating may be received from a system administer (not shown) or the one or more servers 230.

Figure 3:
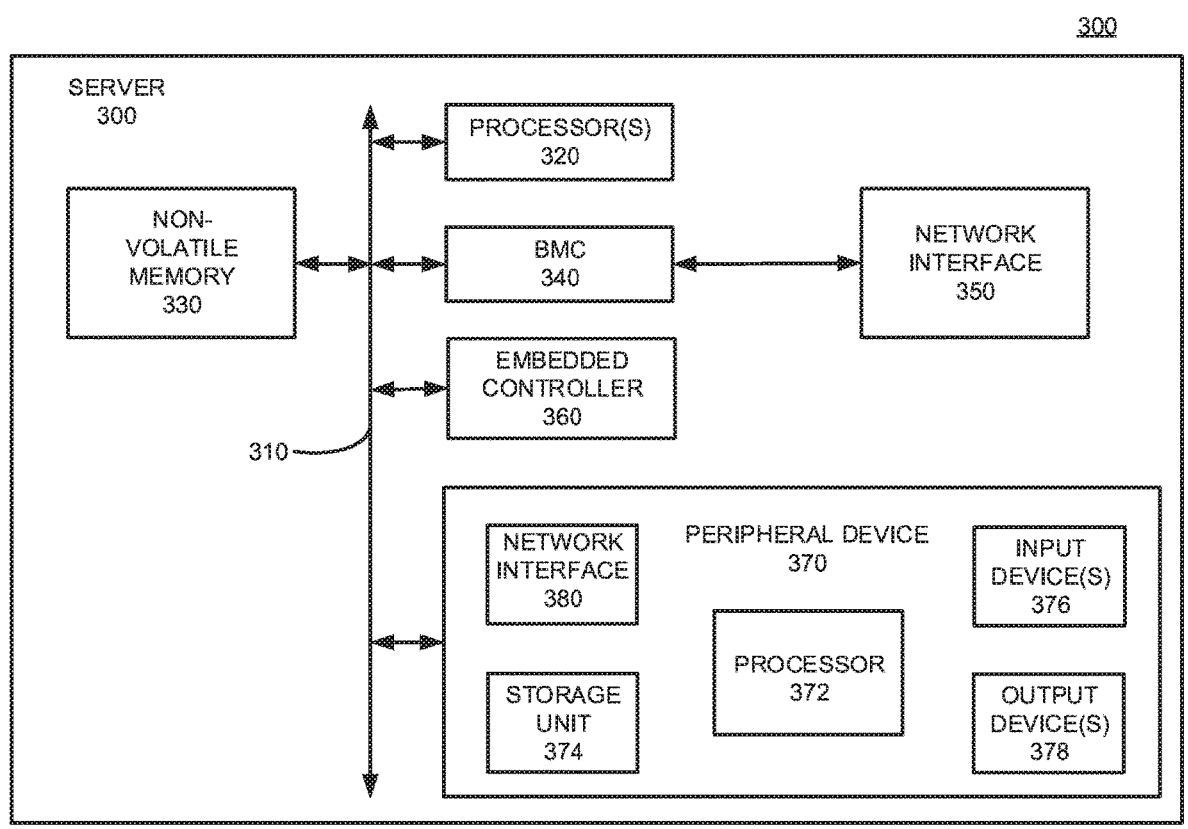
FIG. 3 is a simplified block diagram of an example server in a compute service system, according to certain aspects of the present disclosure.

FIG. 3 is a simplified block diagram of an example server 300 in a compute service system, according to certain aspects of the present disclosure. Many components or modules of the server 300 are omitted in FIG. 3 in order not to obscure the features being described herein. One skilled in the relevant art will appreciate that the disclosed illustrative components are not meant to be an exhaustive identification of all the components required by or present in a server. Rather, illustrative components have been identified, in a non-limiting manner, to facilitate illustration of one or more aspects of the present disclosure. Still further, the illustrative components of the server 300 may be logical in nature such that the physical implementation of one or more components can be varied or such that one or more of the logical components may be implemented in a virtualized manner. Additionally, one or more servers 300 may share one or more of the illustrated or unillustrated components, such as processors, graphical processing units, memory, storage, and the like.

In an illustrative embodiment, the server 300 may be associated with various hardware components, software components, and respective configurations that facilitate the execution of client applications. In some implementations, the server 300 may provide a multi-tenant platform to multiple clients through multiple peripheral devices. In some embodiments, the server 300 may be dedicated to a client at a given time, while no other client may have access to the server 300 at the same time.

In an embodiment, the server 300 may include one or more peripheral devices, such as a peripheral device 370. The peripheral device 370 may communicate with other components of the server 300 via one or more communication channels 310, which may use interfaces such as Peripheral Component Interconnect (PCI) interfaces, PCI Express (PCIe) interfaces, PCI Extended (PCI-X) interfaces, or any other suitable interfaces. The communication channels 310 may include one or more buses, meshes, matrices, fabrics, a combination of these communication channels, or some other suitable communication channels. For example, the communication channel 310 may correspond to a shared bus (e.g., a front side bus, a memory bus), a point-to-point bus such as a PCI or PCIe bus, etc., in which the components of the server 300 communicate.

In an embodiment, the server 300 may be an x86 server. The server 300 may include one or more processors 320, which may include, for example, one or more x86 processor cores, or other circuits capable of executing machine-readable instructions. In some embodiments, the processor(s) 320 may also include GPUs. In some other embodiments, the processor(s) 320 may include Application Specific Integrated Circuits (ASICs), Field Programmable Gate Arrays (FPGAs), Systems-on-Chips (SoCs), Network Processing Units (NPUs), processors configured to execute instructions, or any other circuitry configured to perform logical arithmetic and floating-point operations. In certain implementations, the processor(s) 320 may include multiple processors or processing cores, wherein each processing core may be configured to execute instructions independently. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores, or processing threads executing on the same core may share certain resources, such as, for example, busses, level 1 (L1) caches, and/or level 2 (L2) caches. The instructions executed by the processor(s) 320 may be stored on a computer-readable storage medium, for example, in the form of a computer program.

In some implementations, the server 300 may include a second processor, such as a Baseboard Management Controller (BMC) 340 for managing operations of the server 300. In some embodiments, the BMC 340 may manage the operations of the server 300 in accordance various standards such as, but not limited to, Intelligent Platform Management Interface (IPMI) standard. The BMC 340 may be connected to a network through a network interface 350, such as an Ethernet connection. A system administrator (not shown) may communicate with the BMC 340 through the network interface 350. In some embodiments, a motherboard of the server 300 may include the BMC 340 as a primary controller. Further, the motherboard may include one or more embedded controllers 360 (which may be referred to as satellite controllers) as secondary controllers. In an embodiment, the embedded controllers 360 may be connected to the BMC 340 via an Inter-Integrated Circuit (I$^2$C) interface. In alternative embodiment, the embedded controllers 360 may be connected to the BMC 340 via an Intelligent Platform Management Bus/Bridge (IPMB) interface.

In some embodiments, the BMC 340 may include a processing logic that monitors the physical states of the server 300 using sensors controlled by the embedded controllers 360 and communicate with the system administrator using an independent network connection through the network interface 350. The server 300 may include different types of sensors which are controlled by the embedded controllers 360. The sensors may measure internal physical parameters, such as temperature, humidity, power-supply voltage, fan speeds, communication parameters, and operating system functions, and report to the BMC 340. The BMC 340 may monitor the sensors and send alerts to the system administrator via the network if any of the parameters does not stay within preset limits, indicating a potential failure or risk of the server 300.

In some embodiments, the BMC 340 may provide management and monitoring capabilities independently of the processor(s) 320, the firmware (e.g., Basic Input/output System (BIOS)), and the operating system of the server 300. The BMC 340 may be used by the system administrators for monitoring and managing the operations of the server 300. For example, a system administrator may manage a server that may be powered off or otherwise unresponsive through a network connection to the BMC 340. In some embodiments, the BMC 340 may allow the system administrator to manage the server 300 remotely even in the absence of an operating system or a system management software. System administrators may use the BMC 340 to monitor status of the server 300, such as temperatures, voltages, fans, power supplies, and chassis intrusion. In some embodiments, the system administrators may use the BMC 340 to review hardware logs of different components of the server 300 and to take some corrective actions. For example, the system administrator may use the BMC 340 to perform recovery procedures, such as resetting or rebooting the server 300. In some embodiments, the system administrator may perform actions at the server 300 from a remote console through a network connection, such as an Ethernet connection. In this way, the system administrator can remotely manage numerous servers and other devices simultaneously, thereby saving the overall operating cost of the system and help to ensure reliability of the system.

The server 300 also includes a non-volatile memory 330. The non-volatile memory 330 may include a non-transitory executable code, such as firmware. The non-transitory executable code may be executed by the processor(s) 320 to cause components of the server 300 to initialize and identify system devices, such as the video display card, keyboard and mouse, hard disk drive, optical disc drive, and other hardware. The non-volatile memory 330 may also include firmware for the BMC 340 and the embedded controllers 360. The non-volatile memory 330 may be connected to (or in communication with) a number of components of the server 300, such as the processor(s) 320, the BMC 340, the embedded controllers 360, and the like. In some embodiments, the non-volatile memory 330 may be connected to the components of the server 300 via the communication channels 310. Example of the communication channels 310 includes, but not limited to, Serial Peripheral Interface (SPI) buses, I$^2$C buses, Serial Advanced Technology Attachment (SATA) buses, or other suitable buses. The non-volatile memory 330 may also include or locate boot loader software that may be utilized to boot the server 300. For example, in one embodiment, the non-volatile memory 330 may include an executable code that, when executed by the processor(s) 320, causes the server 300 to attempt to locate Preboot Execution Environment (PXE) boot software. In some embodiments, the non-volatile memory 330 may include a flash memory or a ReadOnly Memory (ROM). In some embodiments, the non-volatile memory 330 may include one memory device. In some other embodiments, the non-volatile memory 330 may include two or more memory devices, where each memory device may store firmware for a component of the server 300. While FIG. 3 illustrates a single non-volatile memory, in various embodiments, the server 300 may include one or more non-volatile memories. For example, each component can have its own non-volatile memory that stores firmware, data, etc. for the component.

In alternative embodiments, the server 300 may include other components or modules (not shown in FIG. 3) for various operations of the server 300. In some embodiments, the server 300 may include a memory module for storing information, for example, Random Access Memory (RAM), Dynamic Random-Access Memory (DRAM), or Synchronous Dynamic Random-Access Memory (SDRAM), such as Double Data Rate (DDR), DDR2, DDR3, or DDR4 SDRAM. In some embodiments, the memory module may include several levels of cache hierarchy, such as Level 1 (L1) caches, Level 2 (L2) caches, Level 3 (L3), or last level caches. In some embodiments, the server 300 may include one or more controllers for managing internal or peripheral devices (not shown) of the server 300, such as hard drives or other forms of memory. One example of the controllers may be a SATA hard drive controller.

The peripheral device 370 includes a processor 372, a storage unit 374, one or more input devices 376, one or more output devices 378, and a network interface 380. In some embodiments, the peripheral device 370 may be coupled to the server 300 via a plug-in card or soldered to the motherboard of the server 300. The peripheral device 370 may provide various functions, such as, but not limited to, traffic monitoring, traffic shaping, computing, billing, encryption, etc. In an embodiment, the peripheral device 370 may perform functions such as, but not limited to, verifying firmware data corresponding to the components of the motherboard, updating the firmware of the components of the motherboard, and preventing any malicious code attack on the server 300. In some embodiments, the peripheral device 370 may also provide physical and virtual services to the server 300. The peripheral device 370 may communicate as a standard bridge component for facilitating access between various physical and emulated components of the server 300, and one or more network fabrics, such as the network fabrics 210 (shown in FIG. 2), using the network interface 380. The peripheral device 370 includes the processor 372 to execute computer executable instructions related to the implementation of management functions of the peripheral device 370. In some other embodiments, the processor 372 may execute the computer executable instructions related to client applications. The processor 372 can be a general-purpose Central Processing Unit (CPU), a processor in an Application-Specific Integrated Circuit (ASIC), System-on-chip (SoC) or any other type of processor. In some embodiments, the peripheral device 370 may include one or more processor configured to execute computer executable instructions to increase processing power.

The storage unit 374 may be a volatile memory (e.g., registers, cache, RAM), a non-volatile memory (e.g., ROM, EEPROM, flash memory, etc.), or some combination of the two, accessible by the processor 372. In some embodiments, the storage unit 374 stores the computer executable instructions for implementing one or more application of the peripheral device 370. In an embodiment, the storage unit 374 may store firmware data corresponding to a hardware device of the server 300. In some embodiments, the storage unit 374 may be a removable or a non-removable memory, and includes magnetic disks, magnetic tapes or cassettes, CD-ROMs, DVDs, or any other medium which can be used to store information in a non-transitory way and which can be accessed within the peripheral device 370. The hardware device may include any component of the server 300 including the processor(s) 320, the BMC 340 or the embedded controllers 360. Further, the hardware device may be coupled to or embedded in the motherboard of the server 300.

The input device(s) 376 may be a touch input device such as a keyboard, mouse, pen, or trackball, a voice input device, a scanning device, or another device that provides input to the peripheral device 370. The output device(s) 378 may be a display, a printer, a speaker, a CD-writer, or another device that provides output from the peripheral device 370. In alternative embodiments, the peripheral device 370 may include ports for the input/output devices 376, 378. In some embodiments, the ports may detectably secure the one or more input devices 376 and the one or more output devices 378 to the peripheral device 370.

The network interface 380 enables communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

In some implementations, the network interface 380 may include hardware and/or software configured to implement a protocol for the communication of peripheral device 370 with externally connected devices or functions. For example, the network interface 380 may include hardware and/or software for communication of the peripheral device 370 with a network. The network interface 380 may include, but not limited to, physical connectors or physical network ports for wired connection to a network, and/or antennas for wireless communication to a network. The network interface 380 may further include hardware and/or software configured to implement a network protocol stack. The network interface 380 may communicate with a network using a network protocol, such as, for example, TCP/IP, InfiniBand, Remote Direct Memory Access (RDMA) over Converged Ethernet (RoCE), Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), and so forth. In some implementations, the peripheral device 370 may include multiple network interface modules, each configured to communicate with a different network, such as a wired Ethernet network, a wireless 802.11 network, a cellular network, or an InfiniB and network.

In some embodiments, the peripheral device 370 may be implemented using multiple discrete hardware elements, such as multiple cards, multiple integrated circuits, or other devices. In some embodiments, the peripheral device 370 may be attached externally to the server 300. In other embodiments, the peripheral device 370 may be integrated with the server 300. For example, the peripheral device 370 may be embedded into the motherboard of the server 300. In various embodiments, the peripheral device 370 may include reconfigurable hardware resources such that they can be dynamically configured into different hardware configurations or to provide different hardware functionalities.

Although not shown in FIG. 3, the peripheral device 370 may include other components or modules, such as mass storage controllers, network controllers, display controllers, memory controllers, serial bus controllers, wireless controllers, or encryption and decryption controllers, among others. For example, the peripheral device 370 may include a non-volatile memory to store firmware. The non-volatile memory may be part of the storage unit 374. The firmware can be executed by the processor 372 to cause components of the peripheral device 370 to initialize and identify modules of the peripheral device 370. The non-volatile memory may include boot loader software that may be utilized to boot the peripheral device 370. The non-volatile memory may also include firmware that may be used to configure and boot the peripheral device 370 for performing different hardware functionalities based on client requests. In some embodiments, the nonvolatile memory may include a flash memory. In some embodiments, the non-volatile memory for the peripheral device 370 may be the same as the non-volatile memory 330. The non-volatile memory may also include instructions, that upon execution by the processor 372, cause the peripheral device 370 to perform functions related to updating firmware of one of more hardware devices of the server 300.

In some implementations, the peripheral device 370 may be a PCI-based device. In these implementations, the peripheral device 370 may include a PCI interface for communicating with other components of the server 300. The term "PCI" may be used to describe any protocol in the PCI family of bus protocols, including the original PCI standard, AGP, PCIe, and PCI-X. The PCI protocols are standard bus protocols for connecting local peripheral devices to servers. A standard bus protocol is a data transfer protocol for which a specification has been defined and adopted by various manufacturers. Manufacturers ensure that compliant devices are compatible with computing systems implementing the bus protocol and vice versa. As used herein, PCI based devices also include devices that communicate using Non-Volatile Memory Express (NVMe), which is a device interface specification for accessing non-volatile storage media attached to a computing system using PCIe.

In some embodiments, various components and modules of the peripheral device 370 and the server 300 described above may be implemented as discrete components, for example, as a System-on-Chip (SoC), as an ASIC, as a NPU, as a FPGA, or any combination thereof.

Figure 4:
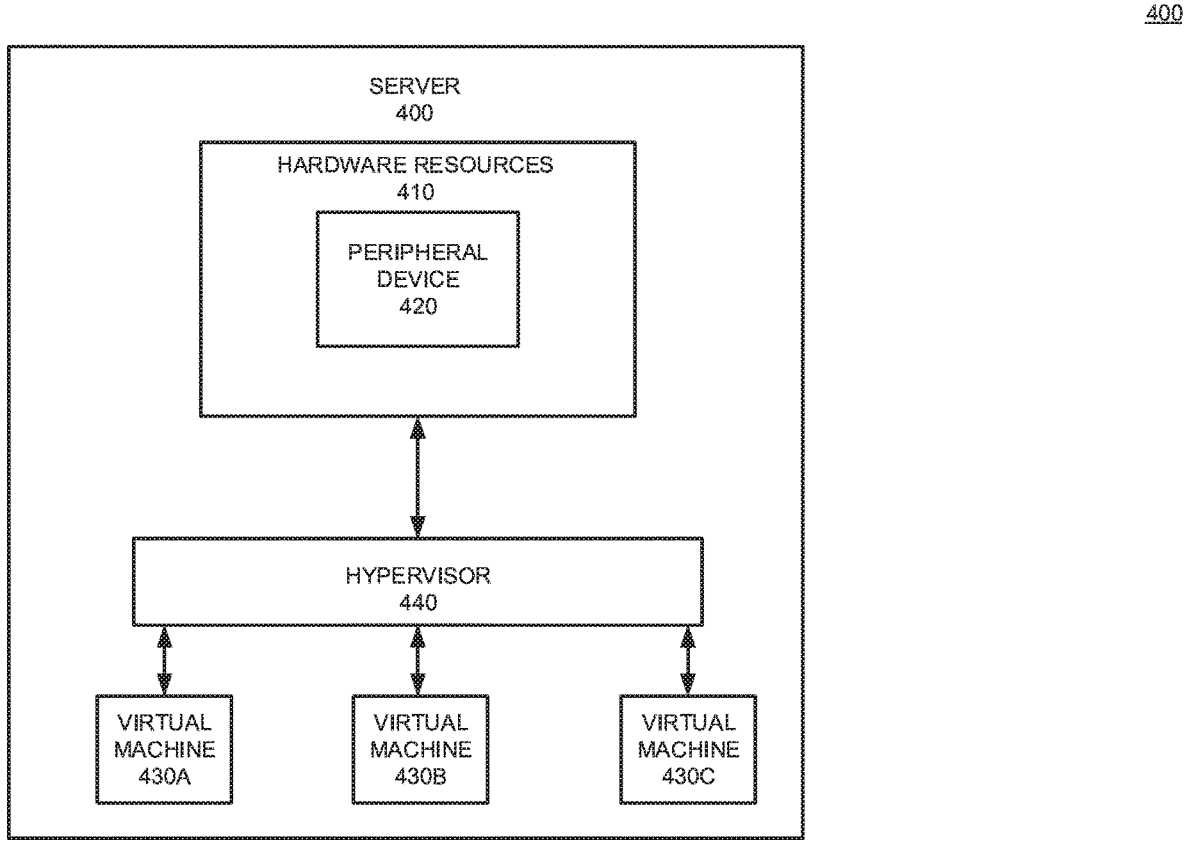
FIG. 4 illustrates an example server configured to provide virtualized services in a compute service system, according to certain aspects of the present disclosure.

FIG. 4 illustrates a server 400 configured to provide host instances, such as non-virtualized (e.g. bare-metal instances), according to certain aspects of the present disclosure. The server 400 may configured to run a hypervisor on underlying hardware resources, where different operating systems may run on the hypervisor in different virtual machines. The server 400 may include hardware resources 410 that include one or more peripheral devices, such a peripheral device 420. The peripheral device 420 may have similar hardware and software configuration as the peripheral device 370 (shown in FIG. 3). In some embodiments, the hardware resources 410 may include a plurality of peripheral devices, where each peripheral device may be used for a corresponding virtual machine. In this example, a client may have installed their own hypervisor on the non-virtualized instance and can use it to control its virtual machines.

As shown in FIG. 4, the server 400 may execute a hypervisor 440 on underlying hardware resources 410. One or more processes, such as virtual machines 430A, 430B, and 430C (collectively referred to as "the virtual machines 430"), may be managed by the hypervisor 440. In some embodiments, one or more virtual hardware of a virtual machine may be emulated by the peripheral device 420. The virtual machines 430 may be any suitable emulation of a computer system. Each virtual machine 430 may communicate with the peripheral device 420 via a data path.

The virtual machines 430 running on the server 400 may be managed by the hypervisor 440. The hypervisor 440 may be configured to create, start, monitor, stop, and delete the virtual machines 430. In addition, the hypervisor 440 may be configured to communicate with the peripheral device 420 such that the peripheral device 420 may create or remove a virtual machine. The virtual machines 430 may be assigned priorities such that the transactions initiated by one virtual machine 430 (e.g., 430A) may take precedence over transactions initiated by another virtual machine 430 (e.g., 430B). In some embodiments, the priorities may only take effect when the resources of the server 400 or the peripheral device 420 are heavily occupied. Priorities may take the form of service level agreements. A service level agreement may indicate an amount of resource usage permitted for a virtual machine. For example, the service level agreements may indicate that a virtual machine (e.g., the virtual machine 430C) may only be allowed a certain amount of network bandwidth, host memory, and/or peripheral device usage.

In some embodiments, the peripheral device 420 may be configured to provide a particular type of instance to a client based on the request from the client. The server 400 may be configured by rebooting using firmware stored in a non-volatile memory on the server 400, such as the non-volatile memory 330 (shown in FIG. 3) described above. In some embodiments, during rebooting, the server 400 may load a customer hypervisor, rather than a hypervisor provided by a compute service provider. After the hypervisor boots, it can be controlled by a customer to launch additional virtual machines. For example, when the customer submits a non-virtualized instance request, the request could identify a virtualization system to load. In response, the compute service provider can prepare the server 400 by attaching a network drive or downloading to storage a non-virtualized instance image, both of which may include a copy of the virtualization system. After the server 400 executes its provisioning process described in more detail in subsequent paragraphs, it can execute the virtualization system from storage.

Figure 5:
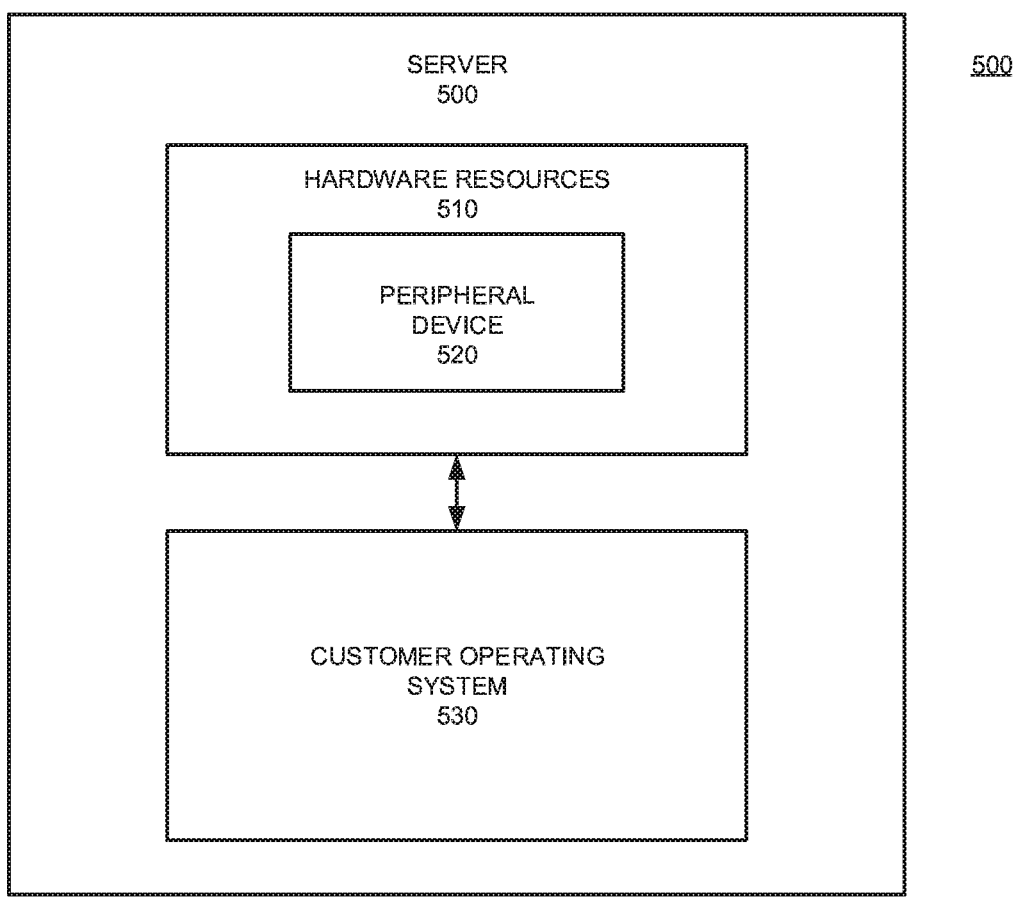
FIG. 5 illustrates an example server configured as an instance in a compute service system, according to certain aspects of the present disclosure.

FIG. 5 illustrates a server 500 configured as a non-virtualized instance in a compute service system, according to certain aspects of the present disclosure. The server 500 may be configured as a non-virtualized instance, and in this case, the customer may execute an operating system directly on the hardware instead of using a virtualization system to virtualize the resources of the server. The server 500 may include hardware resources 510 that include a peripheral device 520. The peripheral device 520 may have similar hardware/software configuration as the peripheral device 420 (shown in FIG. 4). The peripheral device 520 may provide a particular type of instance to a client by rebooting using a firmware corresponding to the particular type of instance. In some embodiments, the firmware may be stored in a non-volatile memory coupled to the server 500.

The server 500 may include a customer operating system 530 running on the hardware resources 510. The server 500 may be configured by rebooting using the firmware stored in the non-volatile memory, such as non-volatile memory 330 (shown in FIG. 3). In some embodiments, after the server 500 is configured, the server 500 may load a customer operating system from a persistent storage device, such as a hard drive or an SSD. After the customer operating system is loaded through the booting process by a boot loader, the client can then run applications on the customer operating system 530 to access and utilize the hardware resources 510.

In this way, the server 500 may be allocated to a client as a non-virtualized instance, and the client may use its own operating system on underlying hardware resources 510 directly, without using a hypervisor or virtualization. The hardware of the non-virtualized instance may be fully dedicated to the client, including any additional storage, during the time period that the server 500 is rented to the client.

Figure 6:
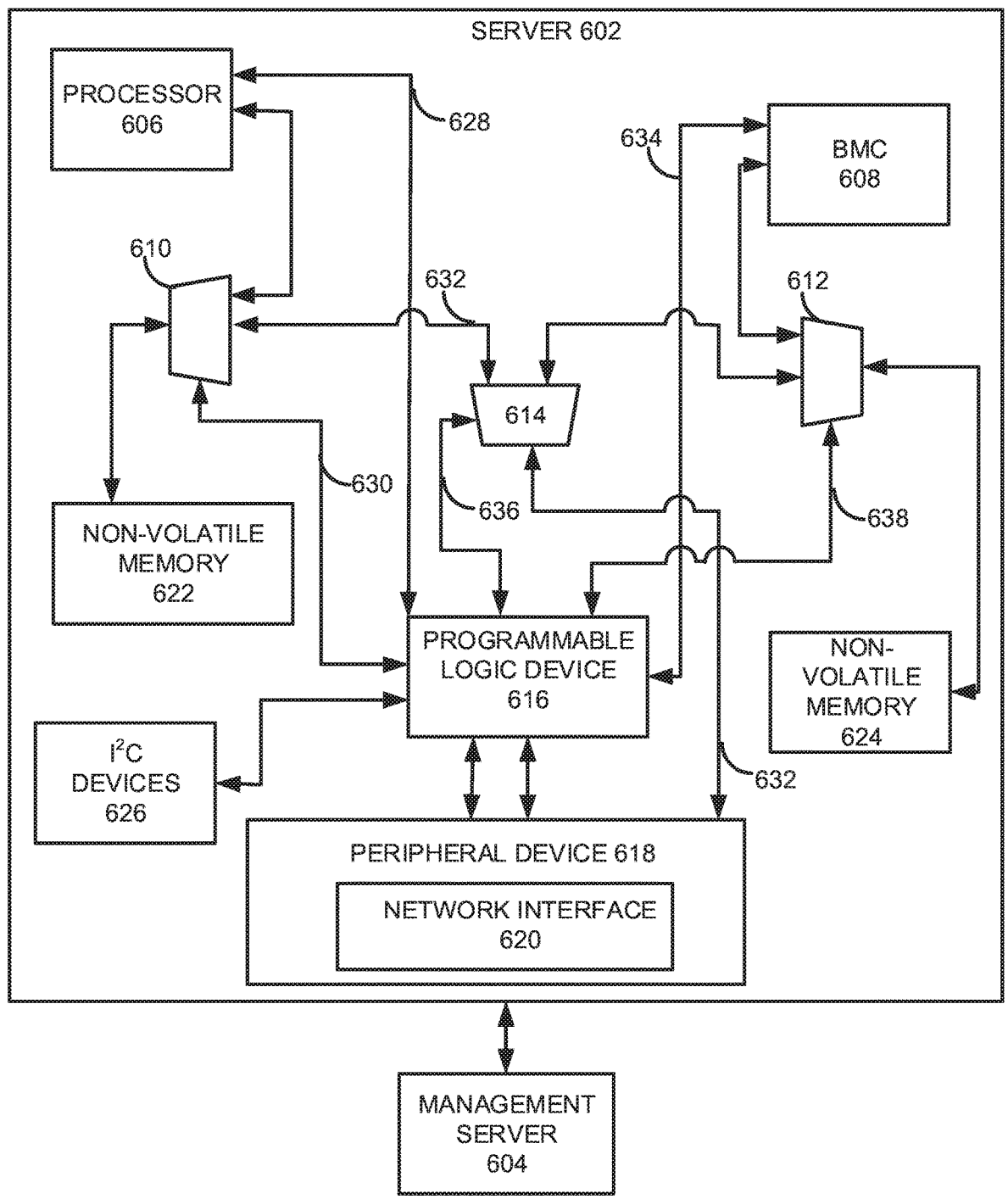
FIG. 6 is a simplified block diagram of an example system, according to certain aspects of the present disclosure.

FIG. 6 is a simplified block diagram of a system 600, according to certain aspects of the present disclosure. The system 600 includes a server 602 and a management server 604. Many components or modules of the server 602 are omitted in FIG. 6 in order not to obscure the features being described herein. One skilled in the relevant art will appreciate that the disclosed illustrative components are not meant to be an exhaustive identification of all the components required by or present in a server. Rather, illustrative components have been identified, in a non-limiting manner, to facilitate illustration of one or more aspects of the present application. Still further, the illustrative components of the server 602 may be logical in nature such that the physical implementation of one or more components can be varied or such that one or more of the logical components may be implemented in a virtualized manner.

The server 602 may include one or more peripheral devices, such as a peripheral device 618. The peripheral device 618 may communicate with the other components of the server 602 using interfaces such as, but not limited to, PCI interfaces, PCIe interfaces, PCI-X interfaces, SPI interfaces, I²C interfaces, Universal Asynchronous Receiver/Transmitter (UART) interfaces or any other suitable interfaces.

The server 602 may include one or more processors 606, which may be similar to the processor(s) 320 (shown in FIG. 3). The server 602 may also include a BMC 608 for managing the operation of the server 602 in accordance with, for example, the IPMI standard. The BMC 608 may be similar to the BMC 340, as shown in FIG. 3. A system administrator may communicate with the BMC 608 through a network interface (not shown in FIG. 6). The network interface may be similar to the network interface 350 (shown in FIG. 3). The server 602 may also include I²C devices 626. The I²C devices 626 may include a Power Supply Unit (PSU) and embedded controllers. The PSU may regulate power supply to various components of the server 602. In some embodiments, the embedded controller may be similar to the embedded controller 360 of FIG. 3. In some embodiments, the I²C devices 626 may also include sensors for measuring physical parameters on the server 602, such as temperature, humidity, power-supply voltage, fan speeds, communications parameters, and operating system functions. In other embodiments, the sensors may use a communication interface different from I²C, such as, but not limited to, SPI, System Management Bus (SMBus), etc.

In some embodiments, the server 602 may also include one or more non-volatile memories, which may store firmware for various components of the server 602, such as the processor(s) 606, the BMC 608, the I²C devices 626, and other system devices, such as the video display card, keyboard and mouse, hard disk drive, optical disc drive etc. In an embodiment, the server 602 may include a non-volatile memory 622 corresponding to the processor(s) 606, and a non-volatile memory 624 corresponding to the BMC 608. The non-volatile memory 622 may be part of a BIOS corresponding to the processor(s) 606. Each of the non-volatile memories 622 and 624 may be accessible via interfaces such as, but not limited to SPI, I²C, SMBus buses and so forth. In some embodiments, each of the non-volatile memories 622 and 624 may include a memory such as, but not limited to, a flash memory, a Read-Only Memory (ROM) and so forth.

The peripheral device 618 may be coupled to the server 602 via a plug-in card or soldered to the motherboard of the server 602. The peripheral device 618 may provide various functions, such as traffic monitoring, traffic shaping, computing, billing, encryption etc. The peripheral device 618 may also provide physical and virtual services to the server 602. In various embodiments, the peripheral device 618 may include various components such as, processors, memory blocks, input/output devices and so forth. In some embodiments, the peripheral device 618 may communicate as a standard bridge component for facilitating access between various physical and emulated components of the server 602 and a network fabric, such as the network fabrics 210 of FIG. 2. The peripheral device 618 may also facilitate access between various physical and emulated components of the server 602 using a network interface 620. In an embodiment, the network interface 620 may be similar to the network interface 280 of FIG. 2. The peripheral device 618 includes a processor (not shown) to execute computer executable instructions related to the implementation of management functions of the peripheral device 618. In some other embodiments, the processor may execute the computer executable instructions related to client applications. In some embodiments, the peripheral device 618 may be implemented using multiple discrete hardware elements, such as multiple cards, multiple integrated circuits, or other devices. In other embodiments, the peripheral device 618 may be attached externally to the server 602. In alternative embodiments, the peripheral device 618 may be integrated with the server 602. For example, the peripheral device 618 may be embedded in the motherboard of the server 602.

To create a non-virtualized execution environment, other components or modules may be added to the server 602, in addition to the components or modules that are similar to the corresponding components or modules in the server 300 of FIG. 3. For example, a programmable logic device 616 may be located on data paths from the processor(s) 606 and the BMC 608 to their corresponding non-volatile memories 622 and 624. Further, the programmable logic device 616 may also be located on data paths from the peripheral device 618 to the processor(s) 606 and the BMC 608. In some embodiments, output pins of the processor(s) 606, the BMC 608, the I²C devices 626 or other components of the server 602 which connect to corresponding non-volatile memory may be coupled to input pins of the programmable logic device 616. Therefore, to access the non-volatile memories 622 and 624, the processor(s) 606, and the BMC 608, commands are routed through the programmable logic device 616 using interfaces such as, SPI, I²C, or SMBus, etc. In an embodiment, the programmable logic device 616 may analyze, block, throttle, and/or filter commands sent to each of the non-volatile memories 622 and 624. As used herein, throttling commands sent to a non-volatile memory may include granting a limited number of read or write requests to access the non-volatile memory per unit time, such as per second, or granting a limited number of read or write requests to access a region in the non-volatile memory per unit time.

The programmable logic device 616 may be connected to and controlled by the peripheral device 618 through various interfaces. The interfaces may include, but limited to, SPI, I²C, or Universal Asynchronous Receiver/Transmitter (UART) bus, General-Purpose Input/Output (GPIO), and so forth. The programmable logic device 616 may maintain a blacklist of protected regions or a whitelist of unprotected regions in the non-volatile memory. In an embodiment, the programmable logic device 616 may control the accessibility of different regions in the non-volatile memories 622 and 624 by the processor(s) 606 and the BMC 608, respectively, at different times based on the blacklist (or whitelist) and instructions from the peripheral device 618. The programmable logic device 616 may include one of an FPGA, an SoC, an ASIC, a Programmable Array Logic (PAL), and a Complex Programmable Logic Device (CPLD). In some embodiments, a firmware for the programmable logic device 616 may also be stored in the non-volatile memories 622 or 624, or in a non-volatile memory of the peripheral device 618. In some embodiments, the peripheral device 618 can verify the software/firmware for the programmable logic device 616 and/or update the software/firmware.

The server 602 may also include a reset controller (not shown). The reset controller may be coupled to the programmable logic device 616 through any communication channel such as, but not limited to, a GPIO bus. In alternative embodiments, the reset controller may be integrated into the programmable logic device 616. The reset controller may be controlled by the programmable logic device 616 to hold the processor(s) 606, the BMC 608, the I²C devices 626 and/or the other components of the server 602 in reset or release them from reset. In some embodiment, the reset controller may hold/release the components of the server 602 at different times based on instructions from the peripheral device 618.

In addition, one or more switches may be added in the communication data paths between the processor(s) 606, the BMC 608, the I²C devices 626 or other components of the server 602, and the programmable logic device 616 or the peripheral device 618. Examples of the communication data paths may include, but not limited to, hard-wired I²C, UART, or SMBus links, PCIe, Low Pin Count (LPC) bus, Universal Serial Bus (USB) and so forth. In an embodiment, the server 602 may include three switches 610, 612 and 614. The switches 610, 612 and 614 may be controlled by the programmable logic device 616 or the peripheral device 618, using control signals such as, but not limited to, a GPIO signal. In some embodiments, the switches 610, 612 and 614 may be configured to enable or disable communications between the processor(s) 606, the BMC 608, and the corresponding non-volatile memories 622 and 624. In some other embodiments, the switches 610, 612 and 614 may be configured to enable or disable communications between the processor(s) 606, the BMC 608 and the peripheral device 618. In yet other embodiments, the switches 610, 612 and 614 may be configured to enable or disable communications between the peripheral device 618 and the non-volatile memories 622 and 624. In some embodiments, each of the switches 610, 612 and 614 may be implemented as a buffer, a multiplexer (MUX) or a de-multiplexer (DEMUX).

The peripheral device 618, the programmable logic device 616, and the switches 610, 612 and 614 may be used in combination and/or with other components to the server 602 to securely update the firmware in the non-volatile memories 622 and 624. In some embodiments, the peripheral device 618 may verify the firmware stored in the non-volatile memories 622 or 624 before powering up the processor(s) 606 or the BMC 608, respectively. In other embodiments, the peripheral device 618 may clean up data of a previous client that may remain in the memories associated with the processor(s) 606 and/or the BMC 608 to ensure secure update of the firmware in the non-volatile memories 622 and/or 624, respectively. In some embodiments, the peripheral device 618 may prevent runtime firmware change in protected regions when the server 602 is used by a client, and prevent unauthorized users from accessing client data and other resources on the server 602.

When performing the above functions, the programmable logic device 616 may operate in either a protected (secure) mode or an unprotected (open) mode at different times based on instructions from the peripheral device 618 or the status of the server 602. In the protected mode, some or all regions in the non-volatile memories 622, and 624 may not be writable and/or readable by some or all components of the server 602. To accomplish this, the programmable logic device 616 may maintain one or more blacklists of regions in non-volatile memories 622 and 624 that cannot be written and/or read by some or all components of the server 602, and one or more whitelists of regions that can be written and/or read by some or all components of the server 602. In some embodiments, the whitelists/blacklists may be used by a programmer to identify the memory regions that can or cannot be accessed in a secure mode and use it to directly program the programmable logic device 616. In an example, the whitelists/blacklists can be programmed or generated by the peripheral device 618 based on a profile associated with the customer that will eventually run on the server 602. In some embodiments, customers may be granted access to modify settings of the server 602 stored in firmware based on whether the customers are trusted or pay an additional fee. The whitelists/blacklists can be stored in a memory and used when transitioning from an open mode to a closed mode to set which regions can be written to or not. In the unprotected mode, some or all regions in non-volatile memory may be readable and/or writable by some or all components of the server 602. The access control may be based on one or more blacklists of protected regions, or one or more whitelists of unprotected regions. When the programmable logic device 616 operates in the unprotected mode, the processor(s) 606, the BMC 608 and the I²C devices 626 may generally be powered off or held in reset state to prevent these components from executing any software.

In some embodiments, some or all firmware in the non-volatile memories 622 and 624 may be verified or validated before enabling any processing functions of the server 602. The firmware verification may be done by the peripheral device 618 through the programmable logic device 616. In an example, the firmware stored in the non-volatile memory 622 may be signed with security digital keys, and the peripheral device 618 may maintain a public digital key that can be used to verify whether the firmware read back from the non-volatile memory 622, through the programmable logic device 616, has been signed with same digital keys or not. In alternative embodiments, the firmware verification may be performed by a remote network-based external key management or security authentication service. The security authentication services may manage digital keys for authentication and provide crypto-processing. For example, the remote network-based external key management or security authentication service may read the firmware in the non-volatile memories 622 or 624 through the programmable logic device 616 and/or the peripheral device 618 and verify the firmware. In some embodiments, the firmware may be verified on demand at any time by the peripheral device 618, and/or the remote network-based external key management or security authentication service, based on a request from an external agent. In some embodiments, the peripheral device 618 can be configured to read the firmware via the programmable logic device 616 for each component installed on the motherboard of the server 602 and compute one or more hash values. These hash values can be compared to reference values stored in the memory of the peripheral device 618.

Therefore, the firmware for the processor(s) 606, the BMC 608, the I²C devices 626 and/or other components of the server 602 may not need be reloaded each time the server 602 is provisioned to a client, and the peripheral device 618 may not need to maintain a whitelist of valid firmware.

In an embodiment, the processor(s) 606, the BMC 608, and the I²C devices 626 may not be powered up or may be held in reset mode during the firmware verification. In some embodiments, the processor(s) 606, the BMC 608, and the I²C devices 626 may be held in reset mode through reset signals transmitted by the reset controller. In some other embodiments, the processor(s) 606, the BMC 608, and the I²C devices 626 may be held in reset mode through GPIO signals using the peripheral device 618 or the programmable logic device 616. The processor(s) 606, the BMC 608, and the I²C devices 626 may be held in reset mode in order to prevent potential malicious code from interfering with secure verification process of the contents in the non-volatile memories 622 and 624. In some embodiments, the peripheral device 618 may control the reset controller directly or indirectly through the programmable logic device 616. The reset signals may not be released until the verification of the firmware is complete. In an embodiment, the peripheral device 618 may cause the programmable logic device 616 to assert a reset signal that causes any execution units to be held in reset while the programmable logic device 616 is in a write-enabled or open mode of operation.

During or after the verification of the firmware in the non-volatile memories 622 and 624, some of the firmware may be updated. For example, firmware or settings changed by a prior customer or firmware that could not be verified or failed the verification may be replaced with appropriate firmware stored in the peripheral device 618, or other storage device connected to the server 602. In some cases, new firmware for the programmable logic device 616 may be loaded in the non-volatile memories 622 or 624, or the non-volatile memory coupled to the peripheral device 618. The firmware update may be permitted only if it is performed from trusted sources, such as the peripheral device 618, over a network interface such as, but not limited to, hard-wired I²C, UART, SMBus links, SPI and so forth. During firmware update, the programmable logic device 616 may operate in the unprotected mode, allowing write operations to access at least some regions in the non-volatile memories 622 or 624. In some embodiments, the programmable logic device 616 may allow write operation to access at least some regions in non-volatile memories (not shown) coupled to the I²C devices 626. For example, when the execution units of the server 602 are held in reset, the peripheral device 618 can execute software that checks whether there are any firmware updates to apply by checking internal storage or contacting the management server 604. The peripheral device 618 can apply firmware updates by writing to the non-volatile memories 622 or 624 via the programmable logic device 616. The peripheral device 618 can also check hashes or digital signatures on the firmware. In response to detecting a mismatch between the hash values or the digital signatures and expected values, the peripheral device 618 can write the correct firmware image to the non-volatile memories 622 or 624.

After the firmware verification and/or modification is complete, the processor(s) 606, the BMC 608, and the I²C devices 626 may be released from reset and begin booting using the verified firmware in the nonvolatile memories 622 and 624. During the booting of the server 602, firmware in the non-volatile memories 622 or 624 may direct the execution units (e.g., the processor(s) 606 or the BMC 608) to load certain extension firmware from an option ROM (extension to BIOS). In an example, the processor(s) 606 may run the extension firmware to scrub data remaining in the non-volatile memory 622 or other processing logic, such as caches, buffers, registers, or DRAMs, etc. In another example, the peripheral device 618 may first expose a preboot environment boot loader, which configures the server 602 to clear RAM or memory attached to components on the motherboard by writing random values or all zeros to the memory. In this example, after the server 602 runs the preboot environment code, the peripheral device 618 may reset the server 602.

In some embodiments, the peripheral device 618 may program the programmable logic device 616 to a protected mode, and devices with firmware or configurable fields may be placed in a read-only state to avoid malicious or non-malicious firmware corruption. Further, some regions within the non-volatile memories 622 and 624 may still be writeable to support critical error logging function for the customer during runtime. In some embodiments, the peripheral device 618 may determine a list of read-only regions in the non-volatile memories 622 and 624. The peripheral device 618 may provide the list of read-only regions to the programmable logic device 616, which may then filter the write operations to the non-volatile memories 622 and 624 based on the list. In some embodiments, the regions that are readable or writable may be rate-limited, for example, to a limited number of read or write accesses to specific regions per second to avoid any malicious attacks. For example, the programmable logic device 616 can be programmed to analyze requests to the non-volatile memories 622 or 624 and determine the type of command and the memory address targeted by the command, and compare the command type and memory address to a whitelist or blacklist. The logic in programmable logic device 616 can deny, filter, or rate-limit commands based on the result of the comparison.

In the protected mode, the processor(s) 606, the BMC 608, and the I²C devices 626 may be isolated from the client data or processes to protect against runtime firmware update attempts. In some embodiments, the BMC 608 may be isolated to prevent attempts to utilize the BMC 608 as a mechanism to gain access to the server 602 from an external network. Thus, any interface such as, but not limited to, the PCIe, LPC, or USB bus between the processor(s) 606 and the BMC 608 may be disconnected using the switches 610, 612 and 614.

Subsequently, the peripheral device 618 can expose a boot loader that causes a customer image, such as a virtualization system or an operating system, to run from a network attached persistent storage device, such as a hard drive or an SSD. After the customer image is loaded through the booting process by a boot loader, the client can utilize hardware resources on the server 602. During runtime of the server 602, the programmable logic device 616 may operate in the protected mode to prevent potential malicious or non-malicious code run by the processor(s) 606, the BMC 608, or other components of the server 602 to change the contents of protected regions in the non-volatile memories 622 and 624.

In various implementations, in the protected mode, the programmable logic device 616 may be configured to filter requests for write operations to the non-volatile memories 622 and 624 from the I²C devices 626 based on the blacklist of protected regions or the whitelist of unprotected regions. In some embodiments, the programmable logic device 616 may be configured to filter requests for write operations to the non-volatile memories 622 and 624 using SPI buses. The programmable logic device 616 may be further configured to monitor write operations to unprotected regions in the non-volatile memories 622 and 624 using SPI buses. The programmable logic device 616 may be further configured to control access to the unprotected regions in the non-volatile memories 622 and 624 from the processor(s) 606 or the BMC 608 by throttling or denying requests if any malicious attack is identified.

In various implementations, in the unprotected mode, the programmable logic device 616 may allow all I²C read and write operations to the non-volatile memories 622 and 624 from some or all devices on the server 602. The programmable logic device 616 may also allow firmware upgrade from trusted sources, such as the peripheral device 618, over a communication channel such as, but not limited to, hard-wired I²C, UART, or SMBus links. In the unprotected mode, the peripheral device 618 may hold the BMC 608 and the processor(s) 606 in reset mode.

In an embodiment, the peripheral device 618 may receive firmware data from the management server 604. The management server 604 may be similar to the management server 220 of FIG. 2. The management server 604 and the server 602 may be communicatively coupled to one or more network fabrics, such as the network fabrics 210 (shown in FIG. 2). In some embodiments, the management server 604 may be communicably coupled to the peripheral device 618 via the network interface 620. The management server 604 may be a server or a platform that is configured to manage a pool of heterogeneous resources (e.g., servers or specialized hardware resources), provide access to clients and end users, monitor security, and manage resource allocation. In some embodiments, a management server module 120 may also transmit firmware updates for various hardware devices or components of the server 602 through the network fabrics 210. The management server 604 may periodically check whether the firmware of the components of the server 602 are up-to-date or corrupted. In case the firmware of any hardware device needs updating or recovery, the management server 604 may transmit appropriate firmware data to the peripheral device 618. In alternative embodiments, the management server 604 may receive requests for updating or recovering the firmware of the one or more hardware devices of the server 602 from the peripheral device 618. The management server 604 may transmit the firmware data based on the request received from the peripheral device 618. In alternative embodiments, the requests for updating may be received from a system administer (not shown) or the server 602.

In an embodiment, the peripheral device 618 monitors the components of the server 602 to check whether the firmware of the hardware devices of the server 602 are up-to-date and operating optimally. In some other embodiments, the server 602 may monitor its hardware devices to check the status of the firmware corresponding to each device. The peripheral device 618 or the server 602 may request the management server 604 for firmware data corresponding to the one or more hardware devices based on the firmware status.

The management server 604 may transmit firmware data to the peripheral device using the network interface 620. The network interface 620 may include any communication interface such as, ethernet. In some embodiments, the management server 604 may transmit the firmware data corresponding to the one or more hardware devices based on the request received from the peripheral device 618 or the server 602. In alternative embodiments, the management server 604 may automatically transmit the firmware data corresponding to the one or more hardware devices based on their firmware status. The firmware data may include an updated firmware image corresponding to the one or more hardware devices. The firmware image may include non-transitory executable code such as, but not limited to, Basic Input/Output system (BIOS) code.

In some embodiments, the peripheral device 618 stores the firmware data on an internal memory. Further, the peripheral device 618 verifies that the firmware data corresponds to a hardware device. The peripheral device 618 may identify the hardware device corresponding to the firmware data based on a comparison of one or more identifiers in the firmware data with a list of identifiers stored in the internal memory. For example, the peripheral device 618 may identify whether the firmware data corresponds to the processor(s) 606, the BMC 608 or the I²C devices 626. In some embodiments, the peripheral device 618 may further authenticate the firmware data and exclude malware by isolating unsigned Unified Extensible Firmware Interface (UEFI) images. In an embodiment, if the peripheral device 618 identifies the firmware data as a corrupted file or containing a malicious code, the peripheral device 618 may reject the firmware data and block the deployment of the firmware data. Further, the peripheral device may transmit a message to the management server 604 indicative of rejection of the firmware data.

After verification and authentication, the peripheral device 618 may hold one or more hardware devices in reset mode. During reset mode, the hardware device is non-operational, and therefore cannot be accessed by any user or client device. In an embodiment, the peripheral device 618 may hold the one or more hardware devices in reset mode using the programmable logic device 616. For example, if a firmware data, as received from the management server 604, corresponds to the processor(s) 606, the peripheral device 618 may transmit a reset signal to the processor(s) 606 via the programmable logic device 616. Similarly, for firmware data corresponding to the BMC 608 or the I²C devices 626, the peripheral device 618 may transmit corresponding reset signals. The peripheral device 618 may also establish a communication channel between the peripheral device 618 and the non-volatile memory associated with the hardware device. For example, in order to update the processor(s) 606, the peripheral device 618 may establish a parallel communication channel with the non-volatile memory 622 using the programmable logic device 616, and the switches 610 and 614. The peripheral device 618 may selectively control the switches 610, 612 and 614 in order to communicate with the non-volatile memories corresponding to the hardware devices.

The peripheral device 618 may store the firmware data on the non-volatile memory corresponding to the hardware device to update the firmware. In some embodiments, the peripheral device 618 may postpone the updating process based on the availability of the hardware device. In an example, the peripheral device 618 may update the firmware after a predetermined time period has elapsed. After the updating process, the peripheral device 618 may release the hardware device from the reset mode.

In an embodiment, the peripheral device may receive firmware data corresponding to the processor(s) 606 via the network interface 620. The peripheral device 618 may hold the processor(s) 606 in reset mode via the programmable logic device 616. In an embodiment, the peripheral device 618 may transmit instructions to the programmable logic device 616. The instructions may be transmitted over an UART bus. Upon receipt of the data signal from the peripheral device 618, the programmable logic device 616 may transmit a reset signal 628 to the processor(s) 606 in order hold the processor(s) 606 in reset mode. In an embodiment, the processor(s) 606 may be communicably coupled to the non-volatile memory 622 through the switch 610. The switch 610 selectively couples the processor(s) 606 to the non-volatile memory 622 based on a control signal 630 received from the programmable logic device 616. In some embodiments, the control signal 630 may be generated by the programmable logic device 616 based on instructions received from the peripheral device 618. During normal operation of the processor(s) 606, the switch 610 may communicably couple the processor(s) 606 with the non-volatile memory 622. During an updating process, the switch 610 isolates the processor(s) 606 from the non-volatile memory 622 based on the control signal 630. Further, the programmable logic device 616 transmits a control signal 636 to the switch 614 based on instructions received from the peripheral device 618. The switch 614 communicably couples the programmable logic device 616 with the switch 610 based on the control signal 636. As a result, the switches 610 and 614 may establish a communication channel 632 between the non-volatile memory 622 and the peripheral device 618. Therefore, the peripheral device 618 may establish the communication channel 632 via the programmable logic device 616 and switches 610, 614. The communication channel 632 may be based on SPI bus. Upon establishment of the communication channel 632, the programmable logic device 616 stores the firmware data on the non-volatile memory 622 using the communication channel 632. After updating the firmware by storing the firmware data at the non-volatile memory 622, the peripheral device 618 may transmit instructions to the programmable logic device 616. The programmable logic device 616 may transmit the control signals 630 and 636 to the switches 610 and 614, respectively, based on the instructions received from the peripheral device 618. The switch 614 may isolate the switch 610 from the peripheral device 618, while the switch 610 may communicably couple the processor(s) 606 with the non-volatile memory 622. The programmable logic device 616 may further release the processor(s) 606 from reset mode using the reset signal 628.

Similarly, for updating the firmware stored on the non-volatile memory 624, the programmable logic device 616 may hold the BMC 608 in reset mode via the reset signal 634. Further, the switch 612 may selectively isolate the BMC 608 from the non-volatile memory 624 based on a control signal 638 received from the programmable logic device 616. Moreover, the switch 614 may communicably couple the switch 612 with the peripheral device 618. The peripheral device 618 may therefore isolate the BMC 608 from the non-volatile memory 624, and establish a communication channel with the non-volatile memory 624 via the programmable logic device 616 and the switches 612, 614. The communication channel may be based on SPI bus. Upon establishment of the communication channel, the peripheral device 618 may store the firmware data corresponding to the BMC 608 at the non-volatile memory 624 in order to update the firmware. After updating, the peripheral device 618 may communicably couple the BMC 608 with the non-volatile memory 624 via the programmable logic device 616 and the switch 612. Further, the peripheral device 618 may release the BMC 608 from reset mode via the programmable logic device 616.

The peripheral device 618 may similarly update the firmware of the I²C devices 626 including the PSU via the programmable logic device 616. In an embodiment, one or more of the I²C devices 626 may include an embedded non-volatile memory for storing firmware. In such cases, the peripheral device 618 may hold the I²C device 626 in reset via the programmable logic device 616, and store the corresponding firmware data on the embedded on-volatile memory. The firmware data may be transmitted over an I²C channel. After updating, the peripheral device 618 may release the I²C device 626 from reset mode.

Therefore, during updating the firmware of a hardware device of the server 602, the peripheral device 618 may hold the hardware device in reset mode, while the other hardware devices of the server 602 are operational. Therefore, there is no requirement for rebooting the whole server 602, thereby reducing or preventing downtime of the system 600.

Figure 7:
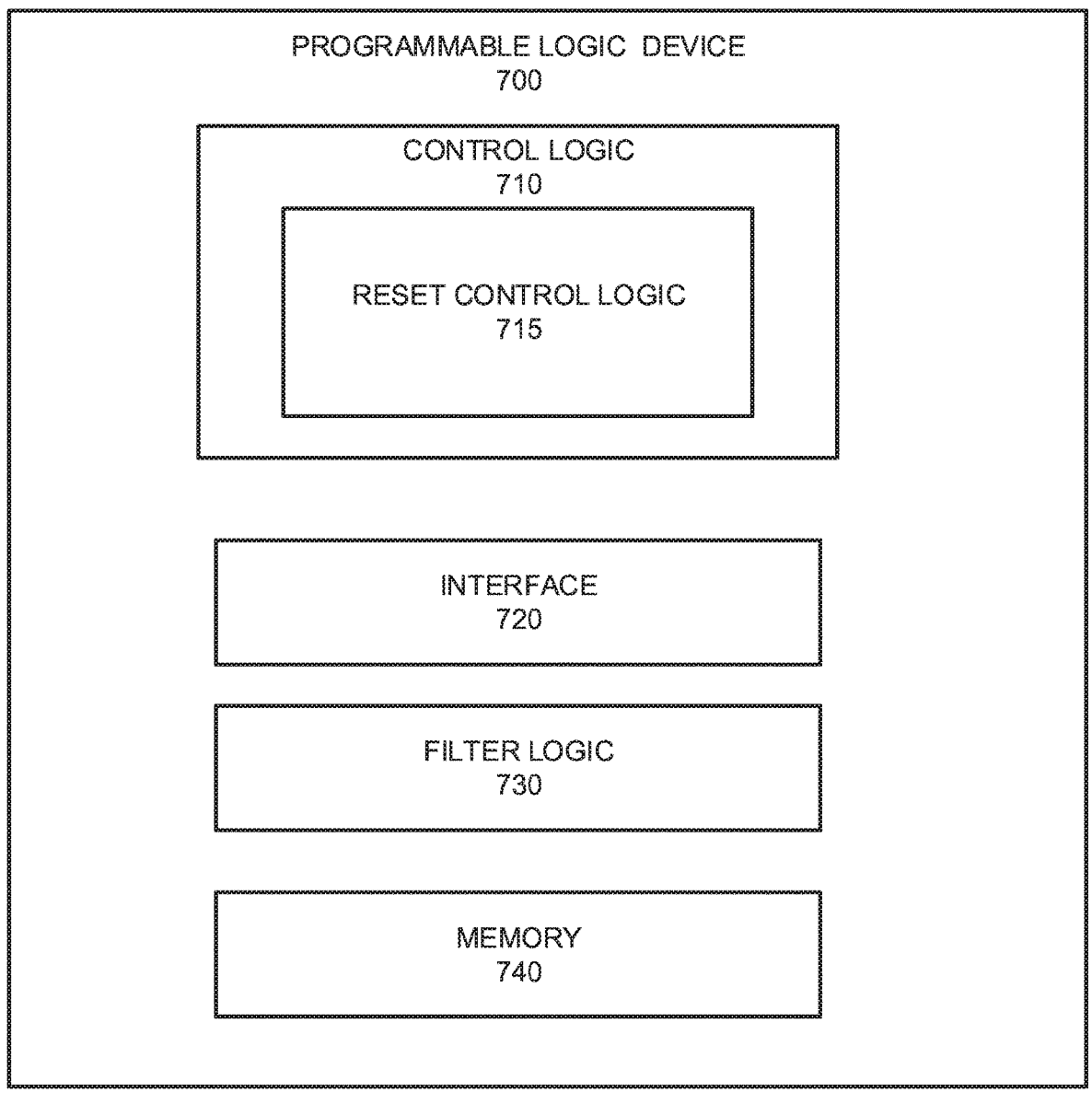
FIG. 7 is a simplified block diagram of a programmable logic device, according to certain aspects of the present disclosure.

FIG. 7 is a simplified block diagram of a programmable logic device 700, according to certain aspects of the present disclosure. FIG. 7 is for illustration purpose only and is not meant to be limiting. One skilled in the relevant art will appreciate that the disclosed illustrative functional blocks are not meant to be an exhaustive identification of all the functional blocks required by or present in a programmable logic device. Rather, illustrative functional blocks have been identified, in a non-limiting manner, to facilitate illustration of one or more aspects of the present application. Still further, the illustrative functional blocks of the programmable logic device 700 may be logical in nature such that the physical implementation of one or more functional blocks can be varied or such that one or more of the logical components may be implemented in a virtualized manner. In various implementations, some of the illustrated functional blocks may be omitted, combined with other functional blocks, or split into multiple functional blocks, without deviating from the scope of the present disclosure.

In some embodiments, the programmable logic device 700 may be similar to the programmable logic device 616 (shown in FIG. 6). The programmable logic device 700 may include a control logic 710 for controlling the general operation of the programmable logic device 700. In an embodiment, the control logic 710 is configured to perform functions such as firmware verification as described above with respect to FIG. 6. The programmable logic device 700 may include interfaces 720, such as pins, that can be used to connect the programmable logic device 700 to various components of a server, such as the server 602 (shown in FIG. 6). In some embodiments, the interfaces 720 may include various communication buses/channels such as, but not limited to, SPI, I²C, GPIO, or UART bus. The programmable logic device 700 may include a filter logic 730 for controlling read/write access to a non-volatile memory of the server, such as the non-volatile memories 622 and 624 of the server 602. The programmable logic device 700 may include a non-volatile memory 740 for storing blacklists of protected regions or whitelists of unprotected regions in the non-volatile memory.

In some embodiments, the control logic 710 may include a reset control logic 715, and interfaces 720 may include an interface to a reset controller associated with a server. The reset control logic 715 may assert a reset signal to hold the execution units (e.g., processors, BMC, etc.) in reset mode, based on signals or instructions from a peripheral device (e.g., the peripheral device 618 of FIG. 6). The reset control logic 715 may then use the interface 720 to release the reset controller, which may then release the execution units from reset mode using reset signals through GPIO pins.

In some embodiments, the interfaces 720 may include an interface to a non-volatile memory 740. The interface 720 to the non-volatile memory 740 may support SPI bus for enabling the peripheral device to read from or write to the non-volatile memory (e.g., non-volatile memories 622 and 624 of FIG. 6). The non-volatile memory 740 may include blacklists of protected regions or whitelists of unprotected regions in the non-volatile memory. In some embodiments, the non-volatile memory 740 may maintain one blacklist for all the components on the server. In some embodiments, the non-volatile memory 740 may maintain separate blacklist for different components on the server.

In some embodiments, the interfaces 720 may include an interface channel to the peripheral device 618. The interface channel to the peripheral device 618 may support, SPI, I²C, GPIO, or UART bus for communicating with the peripheral device 618. In some embodiments, the interfaces 720 may include an interface to the peripheral device 618. The peripheral device 618 may control the operations of the programmable logic device 700, and read from or write to the non-volatile memory through the programmable logic device 700. The peripheral device may read firmware from the non-volatile memory through the programmable logic device 700 to verify the firmware data, as described above with reference to FIG. 6. The peripheral device 618 may also update firmware in the non-volatile memory through the programmable logic device 700. The peripheral device 618 may also provide the blacklists or the whitelists to the programmable logic device 700. The peripheral device 618 may further control the reset controller through the programmable logic device 700.

In some embodiments, the interfaces 720 may include an interface to processor and the filter logic 730. The interface to processor may be used to receive requests to read from and/or write to the non-volatile memory from a processor (e.g., the processor(s) 606 of FIG. 6), receive incoming data from the processor, and send read-back data from the non-volatile memory to the processor. A filter logic for processor may be configured to filter requests for read and/or write operations to the non-volatile memory from the peripheral device on a blacklist of protected regions or a whitelist of unprotected regions as described above, and/or limit the rate of read or write operations to unprotected regions in the non-volatile memory by the processor.

In some embodiments, the interfaces 720 may include an interface to BMC and the filter logic 730. The interface to BMC may be used to receive requests to read from and/or write to the non-volatile memory from a BMC (e.g., the BMC 608 of FIG. 6), receive incoming data from the BMC, and send read-back data from the non-volatile memory to the BMC. A filter logic for BMC may be configured to filter requests for read and/or write operations to the non-volatile memory from the BMC based on a blacklist or a whitelist as described above, and/or limit the rate of read or write operations to unprotected regions in the non-volatile memory by the BMC.

In some embodiments, interfaces 720 may include an interface to I²C devices, which may be used to receive read and write requests to the non-volatile memory from I²C devices (e.g., the I²C devices 626 of FIG. 6), receive incoming data from the I²C devices, and send read-back data from the non-volatile memory to the I²C devices. In some embodiments, the filter logic 730 may include a filter logic for I²C devices as described above with respect to the filter logic for processor and the filter logic for BMC.

In some embodiments, the programmable logic device 700 may also include circuits for controlling the switch(es) on the PCIe, USB, or LPC data path between the processors (including the BMC) to connect or disconnect one processor (e.g., the BMC) and another processor.

The programmable logic device 700 may optionally include option firmware, which may be loaded from, for example, the peripheral device or a non-volatile memory elsewhere in a compute service system, and be used to replace or update firmware in the non-volatile memory or be used by a processor, for example, for memory scrubbing.

In various implementations, the programmable logic device 700 may include one of an FPGA, an SOC, an ASIC, a PAL, and a CPLD.

Figure 8:
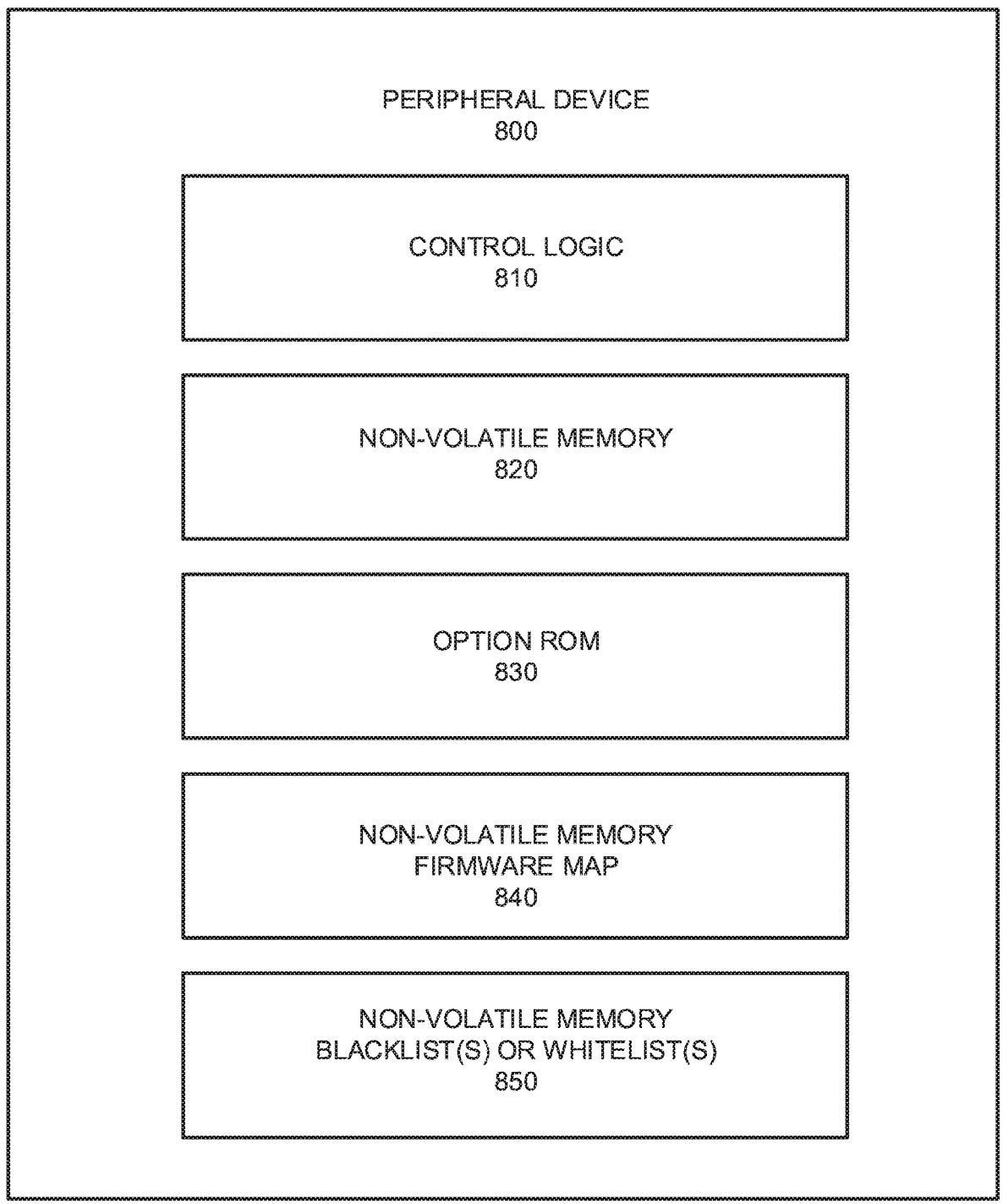
FIG. 8 is a simplified block diagram of a peripheral device, according to certain aspects of the present disclosure.

FIG. 8 is a simplified block diagram of a peripheral device 800, according to certain aspects of the present disclosure. FIG. 8 is for illustration purpose only and is not meant to be limiting. The illustrative functional blocks of the peripheral device 800 may be logical in nature such that the physical implementation of one or more functional blocks can be varied or such that one or more of the logical components may be implemented in a virtualized manner. In various implementations, some of the illustrated functional blocks may be omitted, combined with other functional blocks, or split into multiple functional blocks, without deviating from the scope of the disclosure.

In some embodiments, the peripheral device 800 may include a control logic 810, for controlling the general operation of the peripheral device 800. In some embodiments, the control logic 810 may control the operations of a programmable logic device (e.g., the programmable logic device 616 of FIG. 6) on a server (e.g., the server 602 of FIG. 6). The control logic 810 may also perform functions such as firmware verification and updating, as described above with respect to the FIG. 6. The control logic 810 may determine the status of the booting process of the server, and set the programmable logic device to a protected mode or an unprotected mode accordingly. In some embodiments, the control logic 810 may also send GPIO signals to the server to reset processors on the server or disconnect data paths between the processors on the server (e.g., the processor(s) 606 and the BMC 608 of FIG. 6), by turning on or off switches (e.g., the switches 610, 612 and 614 of FIG. 6). In some embodiments, the control logic 810 may further load extension firmware (e.g., for memory data scrubbing) or a customer operating system or a hypervisor to the server.

In various embodiments, the peripheral device 800 may include a non-volatile memory 820 for storing firmware for the peripheral device 800. In some embodiments, the non-volatile memory 820 may store firmware data for one or more components of a server. The peripheral device 800 may also include an option ROM 830, which may store extension firmware that may be used by a processor (e.g., the processor(s) 610 of FIG. 6) on the server for memory data scrubbing. In some embodiments, the peripheral device 800 may further include a non-volatile memory firmware map 840, which may include information regarding the firmware in a non-volatile memory on the server (e.g., the non-volatile memory 622 of FIG. 6), such as the address range and function of each firmware in the non-volatile memory. In some embodiments, the peripheral device 800 may also include one or more non-volatile memory blacklists or whitelists 850 that may be used to program the programmable logic device for controlling the access to different regions of the non-volatile memory on the server. The non-volatile memory blacklist(s) or whitelist(s) 850 may be predetermined by the compute service provider or a client, or may be determined by the control logic 810 of the peripheral device 800 dynamically. In some embodiments, a client may request write access to certain protected regions in the non-volatile memory on the server during run time, which may be granted at an extra cost.

Figure 9:
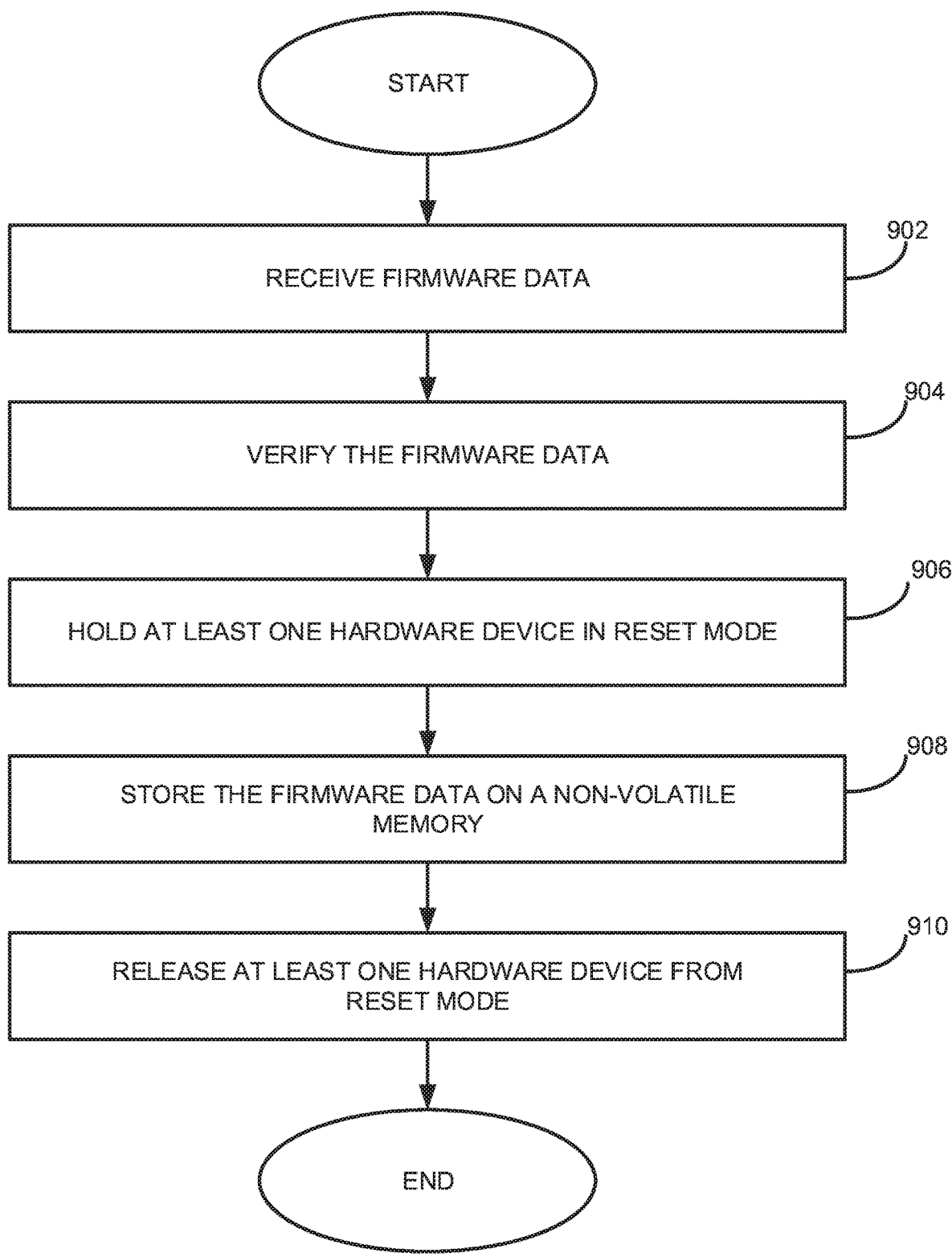
FIG. 9 is a flowchart illustrating a method for secure firmware deployment, according to certain aspects of the present disclosure.

FIG. 9 illustrates a method 900 for secure deployment of the firmware at a computer component, such as at a motherboard of a server. This flowchart is merely provided for descriptive purposes and may be implemented by the systems and/or the servers, as illustrated in any of the preceding figures. For illustration purpose, the method 900 is described with reference to the system 600 shown in FIG. 6.

At step 902, the peripheral device 618 receives firmware data from the management server 604. In some embodiments, the management server 604 may be communicably coupled to the peripheral device 618 via the network interface 620. In other embodiments, the management server 604 may transmit firmware data corresponding to at least one hardware device of the server 602. The management server 604 may periodically check whether the firmware of the components of the server 602 are up-to-date or corrupted. In case the firmware of any hardware device needs updating or recovery, the management server 604 may transmit appropriate firmware data to the peripheral device 618. In alternative embodiments, the management server 604 may receive requests for updating or recovering the firmware of the one or more hardware devices of the server 602 from the peripheral device 618. The management server 604 may transmit the firmware data based on the request received from the peripheral device 618. In alternative embodiments, the requests for updating may be received from a system administer (not shown). In an embodiment, the peripheral device 618 may include instructions that, upon execution, cause the peripheral device 618 to store the firmware data on a memory (not shown in FIG. 6) of the peripheral device 618.

Next at step 904, the peripheral device 618 verifies that the firmware data corresponds to the at least one hardware device. The peripheral device 618 may identify the at least one hardware device corresponding to the firmware data based on a comparison of one or more identifiers in the firmware data with a list of identifiers stored in the internal memory. For example, the peripheral device 618 may identify whether the firmware data corresponds to the processor(s) 606, the BMC 608 or the I$^2$C devices 626. In some embodiments, the peripheral device 618 may further authenticate the firmware data as transmitted by the management server 604. In an embodiment, if the peripheral device 618 identifies the firmware data as a corrupted file or containing a malicious code, the peripheral device 618 may reject the firmware data and block the deployment of the firmware data. Further, the peripheral device may transmit a message to the management server 604 indicative of rejection of the firmware data.

At step 906, the peripheral device 618 holds the at least one hardware device corresponding to the firmware data in reset mode. During reset mode, the at least one hardware device is non-operational, and therefore cannot be accessed by any user or client device. In an embodiment, the peripheral device 618 may hold the at least one hardware device in reset mode using the programmable logic device 616. For example, if a firmware data received from the management server 604 corresponds to the processor(s) 606, the peripheral device 618 may transmit a reset signal to the processor(s) 606 via the programmable logic device 616. Similarly, for firmware data corresponding to the BMC 608 or the I$^2$C devices 626, the peripheral device 618 may transmit corresponding reset signals. The peripheral device 618 may also establish a communication channel between the peripheral device 618 and the non-volatile memory associated with the at least one hardware device. The peripheral device 618 may transmit a control signal to at least one multiplexer (e.g., the switches 610, 612 and 614 of FIG. 6) to selectively couple the non-volatile memory with the at least one hardware device. In some other embodiments, the peripheral device 618 may transmit a control signal to the at least one multiplexer to selectively couple the non-volatile memory with the peripheral device 618.

At step 908, the peripheral device 618 stores the firmware data on the non-volatile memory associated with the at least one hardware device to update the firmware of the at least one hardware device. In some embodiments, the peripheral device 618 may store the firmware data on the non-volatile memory after a predetermined time interval has lapsed. The predetermined time interval may be based upon an ongoing task of the at least one hardware device. Therefore, the peripheral device 618 may schedule the updating process based on the availability of the at least one hardware device. Next at step 910, the peripheral device 618, via the programmable logic device 616, releases the at least one hardware device from reset mode after updating the firmware.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed on, but not limited to, a single local computer (e.g., any suitable commercially available computer), a network environment (e.g., via the Internet, a wide-area network, a local-area network), a client-server network (such as a cloud computing network), and the like, using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in any suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A server configured to securely receive firmware data, comprising:
    a motherboard;
    a peripheral device operating in a trusted execution environment;
    a programmable logic device;
    a first hardware device positioned on the motherboard;
    a second hardware device positioned on the motherboard; and
    a non-volatile memory storing firmware for the first hardware device;
    wherein each of the motherboard, the peripheral device, the programmable logic device, the first hardware device, the second hardware device, and the non-volatile memory are communicatively coupled, and wherein the peripheral device includes instructions that, upon execution, cause the peripheral device to:
    receive firmware data;
    verify that the firmware data corresponds to the first hardware device;
    hold, by the programmable logic device, the first hardware device in reset mode;
    establish, by the programmable logic device, a first communication channel between the peripheral device and the non-volatile memory using a control signal from the programmable logic device to a multiplexer, which switches on the first communication channel and disables a second communication from the first hardware device to the non-volatile memory;
    store the firmware data on the non-volatile memory to update the firmware, while the first hardware device remains in the reset mode and is non-operational, wherein the peripheral device stores the firmware data on the non-volatile memory through a separate communication channel than through the programmable logic device and wherein while the first hardware device remains in the reset mode, the second hardware device remains operational; and
    release, by the programmable logic device, the first hardware device from reset mode after updating the firmware and enabling the second communication channel.

2. The server of claim 1, wherein the peripheral device includes instructions, that upon execution, cause the peripheral device to:
    store the firmware data on a secure storage of the peripheral device.

3. The server of claim 1, wherein the peripheral device includes instructions, that upon execution, cause the peripheral device to:
    establish, via the programmable logic device, a communication channel between the peripheral device and the non-volatile memory of the first hardware device.

4. The server of claim 1, wherein the peripheral device comprises a processor and a secure storage coupled to a circuit board, the circuit board being coupled to the motherboard through an expansion slot on the motherboard.

5. The server of claim 1, further comprising a multiplexer configured to selectively couple the first hardware device with the programmable logic device based on a control signal from the peripheral device.

6. The server of claim 1, further comprising a multiplexer configured to selectively couple the non-volatile memory of the first hardware device with the peripheral device based on a control signal from the programmable logic device.

7. The server of claim 1, wherein the first hardware device is a processor, a baseboard management controller, or a power-supply unit.

8. A method, comprising:
    by a server computer:
        receiving firmware data for a hardware device in the server computer in a peripheral device;
        holding the hardware device in a reset mode through a hardware component, other than the peripheral device, while other components of the server computer remain operational, wherein the hardware device is positioned on a motherboard of the server computer and the other components of the server computer, that remain operational during the reset mode, are positioned on the motherboard so that a portion of the motherboard is held in the reset mode while another portion of the motherboard is operational;
        establishing a first communication channel between the peripheral device and a non-volatile memory using a control signal to a multiplexer, which switches on the first communication channel and disables a second communication from the hardware device to the non-volatile memory;
        providing the firmware data to the non-volatile memory using the first communications channel while the hardware device is in reset mode and the second communication channel is disabled; and
        releasing the hardware device from reset mode and enabling the second communication channel.

9. The method of claim 8, further comprising verifying that the firmware data is authentic.

10. The method of claim 8, further comprising storing, by a processor-based device coupled to the server, the firmware data on a secure storage of the processor-based device.

11. The method of claim 10, further comprising providing, by the processor-based device, the firmware data on the non-volatile memory associated with the hardware device after a predetermined time interval has lapsed.

12. The method of claim 8, wherein providing the firmware data is initiated by a client-initiated trigger.

13. The method of claim 8, wherein the hardware device is a chip, a Baseboard Management Controller (BMC), or a Power Supply Unit (PSU).

14. The method of claim 12, wherein the client-initiated trigger comprises a log-off, a re-start, a timeout, or a client-initiated update or upgrade.

15. A non-transitory computer readable medium storing instructions that, when executed by a server computer, cause the server computer to:
    receive firmware data for a hardware device in the server computer in a peripheral device;
    hold, by a programmable logic device in the server, a hardware device on a motherboard in the server computer in reset mode until a firmware deployment to the hardware device is complete, while other hardware on the motherboard within the server computer remains operational so that a portion of the motherboard is held in the reset mode while another portion of the motherboard is operational;

establish a first communication channel between the peripheral device and a non-volatile memory using a control signal to a multiplexer, which switches on the first communication channel and disables a second communication channel from the hardware device to the non-volatile memory;

provide the firmware data to the non-volatile memory of the hardware device through the first communication channel that bypasses the programmable logic device, to update a firmware of the hardware device, wherein the first communication channel is established for the update of the firmware and the second communication channel from the hardware device to the non-volatile memory is disabled for the update of the firmware; and release, by the programmable logic device, the hardware device from reset mode after updating the firmware and enable the second communication channel.

16. The non-transitory computer readable medium of claim 15, further comprising instructions that, when executed by the server, cause a verification that the firmware data corresponds to the hardware device.

17. The non-transitory computer readable medium of claim 15, further comprising instructions, that upon execution by the server, cause the server to:

store the firmware data on a secure storage of a processor-based device in the server.

18. The non-transitory computer readable medium of claim 15, further comprising instructions, that upon execution by the server, cause a processor-based device in the server to:

store the firmware data on the non-volatile memory after a predetermined time interval has lapsed.

* * * * *